United States Patent
Tamaki et al.

(10) Patent No.: US 10,636,764 B2
(45) Date of Patent: Apr. 28, 2020

(54) LIGHT EMITTING DEVICE

(71) Applicant: NICHIA CORPORATION, Anan-shi, Tokushima (JP)

(72) Inventors: Hiroto Tamaki, Anan (JP); Takuya Nakabayashi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/365,007

(22) Filed: Mar. 26, 2019

(65) Prior Publication Data

US 2019/0221541 A1 Jul. 18, 2019

Related U.S. Application Data

(63) Continuation of application No. 15/784,639, filed on Oct. 16, 2017, now Pat. No. 10,290,607, which is a (Continued)

(30) Foreign Application Priority Data

Sep. 30, 2014 (JP) ................... 2014-201416

(51) Int. Cl.
*H01L 33/50* (2010.01)
*H01L 23/00* (2006.01)
(Continued)

(52) U.S. Cl.
CPC ............ *H01L 24/97* (2013.01); *H01L 33/505* (2013.01); *H01L 33/486* (2013.01); *H01L 33/56* (2013.01);
(Continued)

(58) Field of Classification Search
None
See application file for complete search history.

(56) References Cited

U.S. PATENT DOCUMENTS 5,952,681 A * 9/1999 Chen ..................... H01L 27/153
257/88
2001/0042865 A1 11/2001 Oshio et al.
(Continued)

FOREIGN PATENT DOCUMENTS

CN 202948973 U 5/2013
CN 103155188 A 6/2013
(Continued)

OTHER PUBLICATIONS

Extended European Search Report of the corresponding European Patent Application No. 15187362.7, dated Mar. 29, 2016.
(Continued)

*Primary Examiner* — Bilkis Jahan
(74) *Attorney, Agent, or Firm* — Global IP Counselors, LLP

(57) ABSTRACT

A light emitting device includes first and second light emitting elements, first and second color conversion material layers, a support member and a light reflective member. The first color conversion material layer has a first color conversion surface facing a first light extraction surface of the first light emitting element. The second color conversion material layer has a second color conversion surface facing a second light extraction surface of the second light emitting element. The support member supports the first and second color conversion material layers. The light reflective member covers a first side surface of the first light emitting element and a second side surface of the second light emitting element. At least a part of an upper surface of the light reflective member is positioned closer to the support member than the first color conversion material layer and the second color conversion material layer.

20 Claims, 16 Drawing Sheets

Related U.S. Application Data continuation of application No. 14/867,222, filed on Sep. 28, 2015, now Pat. No. 9,825,001.

(51) Int. Cl.
*H01L 33/48* (2010.01)
*H01L 33/56* (2010.01)

(52) U.S. Cl.
CPC .............. *H01L 2224/16225* (2013.01); *H01L 2224/48091* (2013.01); *H01L 2933/0041* (2013.01)

(56) References Cited

U.S. PATENT DOCUMENTS

| | | | |
|---|---|---|---|
| 2006/0208271 A1 | 9/2006 | Kim et al. | |
| 2010/0013741 A1 | 1/2010 | Watanabe | |
| 2010/0038665 A1 | 2/2010 | Sugiura et al. | |
| 2011/0121731 A1* | 5/2011 | Tsutsumi | H01L 25/0753 315/77 |
| 2011/0309384 A1 | 12/2011 | Ito et al. | |
| 2012/0007131 A1 | 1/2012 | Ueno et al. | |
| 2013/0094180 A1 | 4/2013 | Sun et al. | |
| 2013/0170179 A1 | 7/2013 | Kadomi et al. | |
| 2013/0240934 A1 | 9/2013 | Park et al. | |
| 2014/0001503 A1 | 1/2014 | Ahlstedt et al. | |
| 2014/0001657 A1 | 1/2014 | Ebe et al. | |
| 2014/0001948 A1 | 1/2014 | Katayama et al. | |
| 2014/0153238 A1 | 6/2014 | Nishimura et al. | |
| 2014/0328083 A1 | 11/2014 | Oh et al. | |
| 2014/0367729 A1 | 12/2014 | Ebe et al. | |
| 2015/0009681 A1 | 1/2015 | Takase | |
| 2015/0255313 A1 | 9/2015 | Brandl et al. | |
| 2015/0333232 A1 | 11/2015 | Preus et al. | |
| 2019/0221541 A1* | 7/2019 | Tamaki | H01L 33/505 |

FOREIGN PATENT DOCUMENTS

| | | |
|---|---|---|
| CN | 103346243 A | 10/2013 |
| DE | 102012109905 A1 | 4/2014 |
| DE | 102012113003 A1 | 4/2014 |
| JP | H11-329726 A | 11/1999 |
| JP | 2010-192629 A | 9/2010 |
| JP | 2011-054795 A | 3/2011 |
| JP | 2011-108589 A | 6/2011 |
| JP | 2012-119407 A | 6/2012 |
| JP | 2012-134355 A | 7/2012 |
| JP | 2012-527742 A | 11/2012 |
| JP | 2013-077679 A | 4/2013 |
| JP | 2013-140894 A | 7/2013 |
| JP | 2013-183057 A | 9/2013 |
| JP | 2013-197279 A | 9/2013 |
| JP | 2014-110333 A | 6/2014 |
| JP | 2014-127679 A | 7/2014 |
| JP | 2014132629 A | 7/2014 |
| JP | 2014-168033 A | 9/2014 |
| JP | 2014-168035 A | 9/2014 |
| NL | 2011840 A | 1/2015 |
| WO | 2008-044759 A1 | 4/2008 |
| WO | 2010140411 A1 | 12/2010 |
| WO | 2015-014874 A1 | 2/2015 |
| WO | 2015-014875 A1 | 2/2015 |

OTHER PUBLICATIONS

Non Final Office Action of the U.S. Appl. No. 14/867,222, dated Jun. 6, 2016.
Final Office Action of the U.S. Appl. No. 14/867,222, dated Nov. 7, 2016.
Advisory Action of the U.S. Appl. No. 14/867,222, dated Feb. 17, 2017.
Non Final Office Action (second) of the U.S. Appl. No. 14/867,222, dated Mar. 9, 2017.
Notice of Allowance of the U.S. Appl. No. 14/867,222, dated Jul. 17, 2017.
Non Final Office Action of the U.S. Appl. No. 15/784,639, dated Aug. 9, 2018.
Notice of Allowance of the U.S. Appl. No. 15/784,639, dated Jan. 2, 2019.
Corrected Notice of Allowability of the U.S. Appl. No. 15/784,639, dated Mar. 21, 2019.

* cited by examiner

LIGHT EMITTING DEVICE

CROSS-REFERENCE TO RELATED APPLICATIONS

This application is a continuation application of U.S. patent application Ser. No. 15/784,639, filed on Oct. 16, 2017, which is a divisional application of U.S. patent application Ser. No. 14/867,222, filed on Sep. 28, 2015, now U.S. Pat. No. 9,825,001. This application claims priority to Japanese Patent Application No. 2014-201416 filed on Sep. 30, 2014. The entire disclosures of U.S. patent application Ser. Nos. 15/784,639 and 14/867,222 and Japanese Patent Application No. 2014-201416 are hereby incorporated herein by reference.

BACKGROUND

1. Field of the Invention

The present invention relates to a light emitting device and a method for manufacturing thereof.

2. Description of Related Art

As the quality of light emitting diodes has improved in recent years, they are used with various configurations in the field of general lighting, the field of automotive lighting, and so forth.

For example, an effort to obtain smaller and thinner light emitting devices has been made.

Also, chromaticity and color reproducibility of a light emitting device improved by using various kinds of color conversion materials in combination with a light emitting diode that has achieved high output, high brightness, and so forth (For example, JP 2012-119407A, JP2012-527742A, JP2013-197270A and WO2008/044759).

However, in recent years, color conversion materials with poor durability are becoming more frequently used, and in this case, obtaining a small and thin light emitting device with good chromaticity and color reproducibility may be difficult.

SUMMARY

It is an object of the present invention to provide a light emitting device and method for manufacturing thereof, with which a light emitting element with a small and thin size can be obtained while desired chromaticity and good color reproducibility can be achieved by a simple method.

A light emitting device according to the present disclosure includes a first light emitting element, a second light emitting element, a first color conversion material layer, a second color conversion material layer, a support member and a light reflective member. The first light emitting element has a first electrode formation surface on which a pair of electrodes are arranged, a first light extraction surface opposite from the first electrode formation surface, and a first side surface extending between the first electrode formation surface and the first light extraction surface. The second light emitting element has a second electrode formation surface on which a pair of electrodes are arranged, a second light extraction surface opposite from the second electrode formation surface, and a second side surface extending between the second electrode formation surface and the second light extraction surface. The first color conversion material layer has a first color conversion surface facing the first light extraction surface of the first light emitting element. The second color conversion material layer has a second color conversion surface facing the second light extraction surface of the second light emitting element. The support member supports the first color conversion material layer and the second color conversion material layer. The light reflective member covers the first side surface of the first light emitting element and the second side surface of the second light emitting element. At least a part of an upper surface of the light reflective member is positioned closer to the support member than the first color conversion material layer and the second color conversion material layer.

According to the present disclosure, it is possible to provide a light emitting device and method for manufacturing thereof, with which a light emitting device with small and thin size can be obtained while even better chromaticity and color reproducibility can be achieved by a simple method.

DETAILED DESCRIPTION

Embodiments for implementing the light emitting device and the method for manufacturing thereof of the present invention will be described below with reference to the accompanying drawings. In the following embodiment, the light emitting device and the method for manufacturing thereof that embody the technological concept of the present invention are just examples, and unless otherwise specified, the constituent parts discussed in the embodiments are not intended to limit the scope of the present invention. Further, constitutions described in examples and the embodiments can be employed in other examples and embodiments.

The sizes and the arrangement relationships of the members in each of drawings are occasionally shown exaggerated for ease of explanation.

Light-Transmissive Member

The light-transmissive member of the present embodiment includes a sheet and a color conversion material layer. In one embodiment, the light-transmissive member includes a light-reflective sheet that has a through-hole, and a color conversion material layer that includes a light-transmissive resin containing a color conversion material and disposed in the through-hole. The light-transmissive member preferably has suitable strength, and is self-standing. Therefore, it does not necessarily have to be rigid, and it is preferably flexible enough so that the color conversion material layer can be held without being damaged.

Figure 2A:
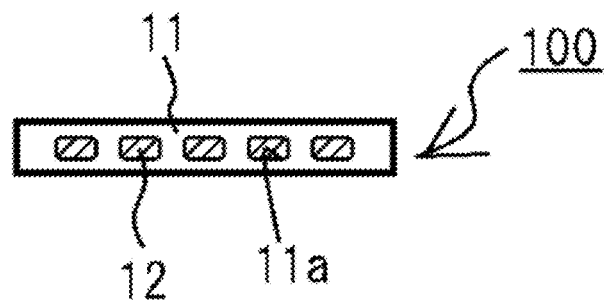
FIG. 2A is a schematic plan view of a light-transmissive member according to an embodiment of the present invention.
Figure 2B:
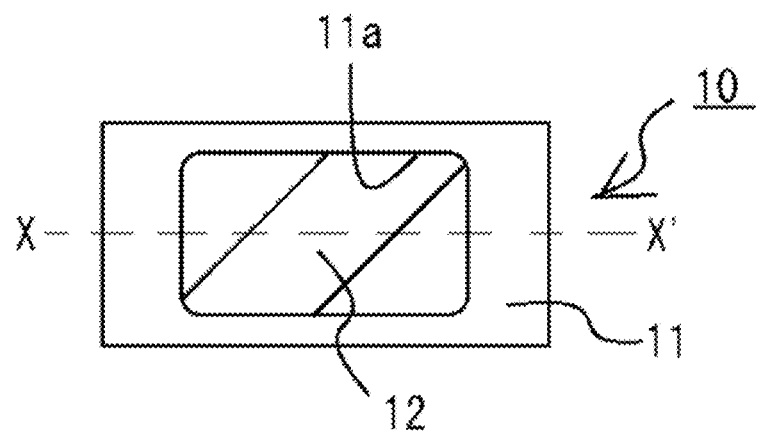
FIG. 2B is a schematic plan view of a light-transmissive member according to another embodiment of the present invention.
Figure 2C:
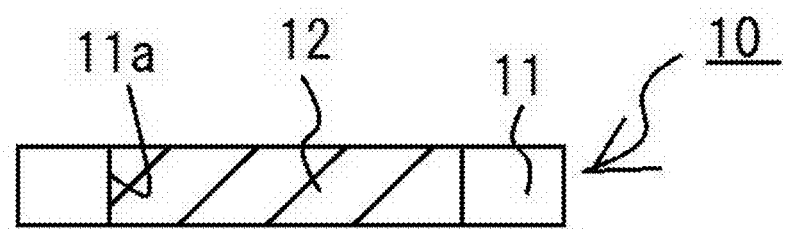
FIG. 2C is a schematic cross sectional view along the X-X' line of the light-transmissive member in FIG. 2B.

At least one of the same surface sides of the sheet and the color conversion material layer, such as the upper surfaces, can be flush, that is, can be level or in a same plane, without any step between their upper surfaces, as shown in FIG. 2C. The terms "flush", "level", "in the same plane" and "without any step" here is intended to allow unevenness of about several dozen microns, and preferably about a few dozen microns. For example, these terms include the structure where no intentional processing is performed on the surfaces so that one of the surfaces protrudes above the other. Accordingly, the dimensions of the color conversion material layer can be stabilized, and in turn those of the light-transmissive member, and thus proper assembly to the other members can be achieved. Stabilizing the dimensions of the light transmissive layer also allows facilitating to provide a lens or the like on the upper surface of the color conversion material layer.

Figure 8:
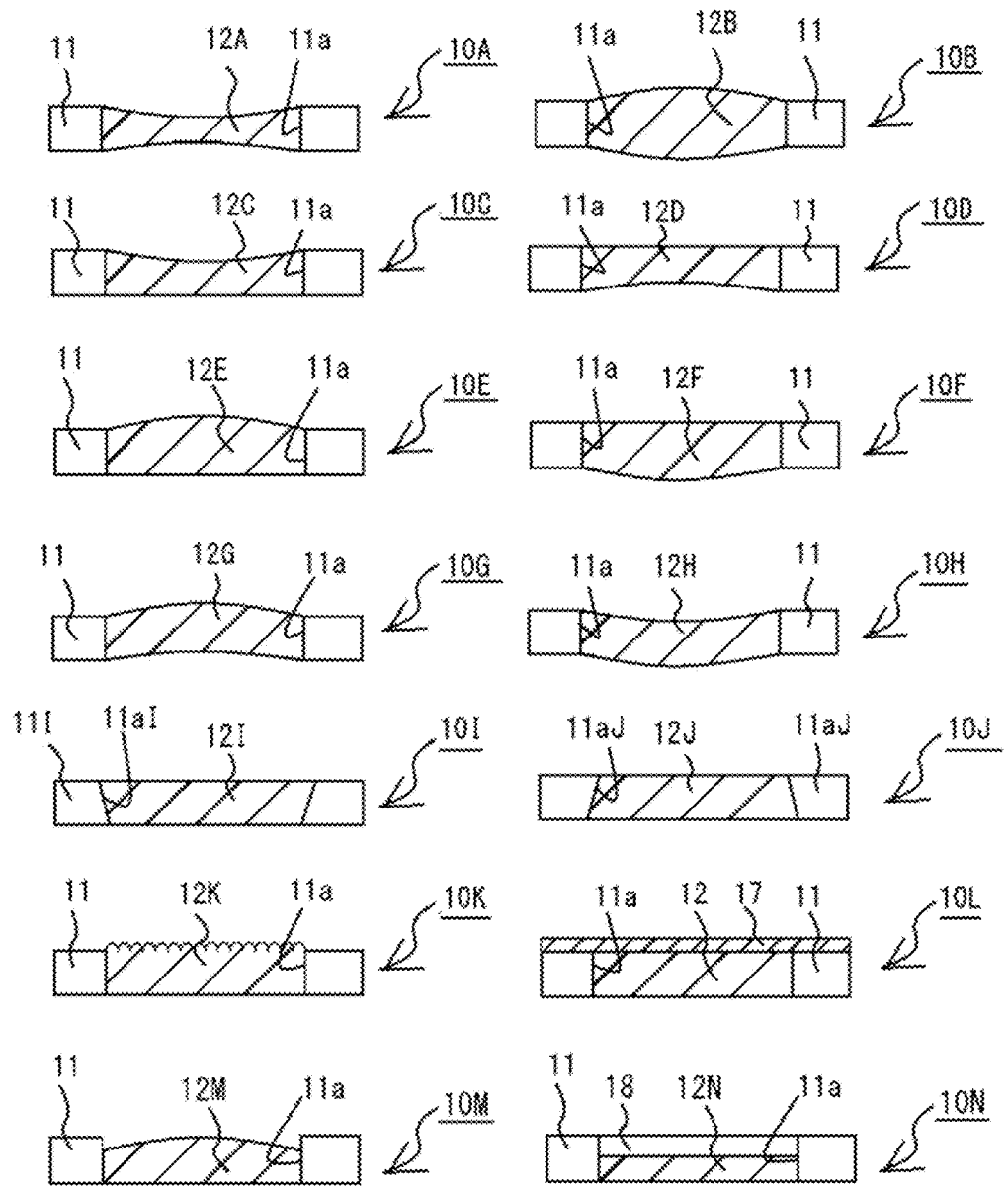
FIG. 8 is schematic plan view of a light-transmissive member according to other embodiment of the present invention.

Alternatively, the color conversion material layer may have recess and/or protrusion (concave and/or convex) with respect to the upper surface and/or the lower surface of the sheet (see the light-transmissive members 10A to 10H in FIG. 8). In the case where the color conversion material layer is concave, light convergence or another such effect can be exhibited. In the case where it is convex with respect to the lower surface of the sheet, bonding performance or bonding adhesion to the light emitting element being used can be improved. In the case where it is convex with respect to the upper surface of the sheet, this improves the light extraction efficiency.

The light-transmissive member may have a flat shape or, for example, being intentionally machined to have a bend, curve, etc. This allows the light-transmissive member to be thin. Alternatively, it may have the shape of a so-called micro-lens, a fly-eye lens, or the like, in which the upper surface of the color conversion material layer has a shape that is textured in the thickness direction of the light-transmissive member itself (see the light-transmissive member 10K in FIG. 8). This allows the light emitting device with the light-transmissive member to improve optical coupling efficiency to a light-guide plate in the case of being used in a backlight, for example, depending on the application of the light-transmissive member.

The light-transmissive member may include one color conversion material layer in the through-hole of on one sheet, or may include a plurality of color conversion material layers are arranged in the through-holes of one sheet so that the color conversion material layers are respectively disposed in the respective through-holes. A size of the light-transmissive member in the case of disposing just one color conversion material layer is preferably somewhat greater than the size of the light emitting element, etc., being used. For example, it may measure 0.1 to 200×0.1 to 200 mm. The size of the light-transmissive member in the case of disposing a plurality of color conversion material layers can be suitably set depending on the size, number, and so forth of the color conversion material layer discussed below.

The outer peripheral portion of the color conversion material layer of the light-transmissive member (that is, a sheet) may be machined to provide the through-hole or to be in a fittable shape. In the case where the light-transmissive member is relatively large, and/or is long and slender, it is preferable to provide a shape for positioning or fitting to other components. This allows making assembly and joining to the light emitting device or the light emitting element discussed below without any misalignment.

Sheet

The sheet is a member that supports the color conversion material layer. The sheet is light reflective. The term "light reflective" here means that the light reflectivity with respect to the light emitted from the light emitting element is at least 60%, and preferably at least 70%, 80%, or 90%.

Also, "light reflective sheet" includes a sheet whose material is light-reflective and a sheet where a material which is not light-reflective is processed to be imparted with light-reflectivity. The processing to be light reflective can be performed in any step of the manufacturing the light-transmissive member.

That is, for the light reflective sheet, a light reflective material (a first light reflective material) or a material that is not light reflective, such as a light-transmissive material or a light absorbent material, may be used.

Examples of the light reflective materials include metals and light reflective substances (e.g., titanium dioxide, silicon dioxide, zinc dioxide, zirconium dioxide, potassium titanate, alumina, aluminum nitride, boron nitride, mullite, niobium oxide, barium sulfate, coloring agent, and various types of rare earth oxides such as yttrium oxide, gadolinium oxide, etc.). The metal or light reflective substance may itself be made into a sheet, or a granular material may be formed into a sheet with a binder such as a resin.

For instance, the sheet can be either a single layer or a stack of a metal or a dielectric material. Further, the light reflective sheet can be obtained by adding the above-mentioned light reflective substance in an amount of about 10 to 95 wt %, and preferably about 20 to 80 wt %, and more preferably about 30 to 70 wt %, and even more preferably about 30 to 60 wt %, to a resin, an inorganic material, glass, or the like, or a composite thereof. The light reflective sheet can also be one in which the surface of one of these metal, dielectric, or resin sheets is covered with a light reflective substance or a metal film (a second light reflective material), etc. Such an arrangement allows facilitating to form the sheet as desired. It also allows ensuring a sufficient strength. Furthermore, sufficient resistance can be ensured against temperature changes in the filling and curing of the light-transmissive resin discussed below.

Examples of the materials of metals used for the light reflective metal films include single layer films or laminate films of silver, aluminum, copper, gold, platinum, palladium, rhodium, nickel, tungsten, molybdenum, chromium, titanium, and alloys of these. The material for the metals used for the light reflective sheet is similar to these. Examples of the dielectric film include single layer film and laminate films that are used in this field. An example is $SiO_2/Nb_3O_5$ or other such laminate.

Examples of resins that can serve as a base material include thermosetting resins, thermoplastic resins, modified resins of these resins, and hybrid resins that contain one or more of these resins. Specific examples of the resin includes epoxy resins, modified epoxy resins (silicone-modified epoxy resin, etc.), silicone resin, modified silicone resin (an epoxy modified silicone resin, etc.), hybrid silicone resin, a polyimide (PI), a modified polyimide resin, polyamide (PA), polyethylene terephthalate resin, polybutylene terephthalate (PBT), GF reinforced polyethylene terephthalate (GF-PET), polycyclohexane terephthalate resins, polyphthalamide (PPA), polycarbonate (PC), polyphenylene sulfide (PPS), polysulfone (PSF), polyether sulfone (PES), a modified polyphenylene ether (m-PPE), polyether ether ketone (PEEK), polyetherimide (PEI), liquid crystal polymer (LCP), ABS resin, phenol resin, acrylic resin, PBT resin, urea resin, BT resin, a polyurethane resin, polyacetal (POM), an ultrahigh molecular weight polyethylene (UHPE), a syndiotactic polystyrene (SPS), an amorphous polyarylate (PAR), a fluorocarbon resin, and an unsaturated polyesters.

Examples of the inorganic materials include single layer structures or multilayered structures that contain aluminum oxide, aluminum nitride, zirconium oxide, zirconium nitride, titanium oxide, titanium nitride, zinc oxide, mixtures of these, or other such ceramics, or low-temperature sintered ceramics, etc.

As the light transmissive material, the light transmissive material of the above-mentioned resin, glass, a dielectric material or the like can be used. As the light absorbing material, ceramics described above, paper, fiber, pulp, carbon, a dielectric, a composite material such as glass epoxy or the like can be used. Light absorbing material may have a light conversion function. In the case where the light reflective sheet is formed from one of these light-transmissive materials and/or light absorbing materials, the light reflective characteristics that are given during manufacturing of the light-transmissive member are preferably obtained by covering the inner surface of a through-hole (or through-holes) discussed below and a surface of the light reflective sheet with a light reflective material. It is preferable that the entire surfaces including the front and bark and the side surfaces is covered by the light reflective material, but a part of the sheet may not be covered, as long as substantially the entire surfaces of the side walls of the through-hole touching the color conversion material layer is covered by the light reflective sheet.

The light reflective sheet may contain a diffusing agent, a light scattering agent (such as barium sulfate, titanium dioxide, aluminum oxide, or silicon oxide), or the like. Also, any glass cloth, filler, or the like such as glass fiber, wollastonite, and other such fibrous fillers, and carbon, silicon oxide, and other such inorganic fillers used in the field of semiconductor BGA mounting may be contained in order to ensure good heat dissipation, strength, etc.

In particular, it is preferable for the light reflective sheet to be obtained by forming a light reflective material that contains a light reflective substance and a resin into the light reflective sheet, since such sheets are readily available.

The thickness of the light reflective sheet can be suitably set according to the materials being used and so forth, and it is preferably thick enough to ensure the proper strength and light reflectivity. For example, the thickness may be from a few dozen microns to about 1 mm, with a few dozen microns to about 500 μm being preferable, and about 100 to 300 μm being even preferable.

In addition to the light reflective substance and the light transmissive resin, the reflective sheet may also contain a light emitting material. In particular, in the case where the size of the through-hole, in which the color conversion material layer is disposed, is smaller than the light emitting element, containing the light emitting material allows reducing the escape of light (e.g., blue light) from the light emitting element.

The size of the through-hole in plan view may be, for example, {a few hundred microns to a few millimeters}×{a few hundred microns to a few millimeters}, or {a few hundred microns to 1 mm}×{a few hundred microns to 1 mm}, or a shape with a size that corresponds to these surface areas. Examples of the shape of the through-hole in plan view include circular, elliptical, polyhedral, and shapes that are approximate to these. It is especially preferable for the plan view shape of the through-hole to be substantially similar to the plan view shape of the light emitting element.

The through-hole may have the same shape and size in the thickness direction of the sheet, or their shape and size may vary from one surface to the surface opposite to the one surface as shown see the light-transmissive members 10I and 10J in FIG. 8 such as a truncated elliptical cone or a truncated prismatic cone.

The size and shape of the through-hole may correspond to the size and shape of the color conversion material layer.

In the case where a plurality of through-holes are arranged on a single sheet, it is preferable that they are spaced enough that the sheet will not be broken by the arrangement of the through-holes. An example of a spacing between the through-holes is about 0.01 mm to a few millimeters. This arrangement may be random, or the through-holes may be arranged in a ring shape as shown in the light-transmissive member 100A in FIG. 9, and the through-holes are preferably arranged regularly in the row and or column direction as shown in FIGS. 1D and 2A.

Color Conversion Material Layer

The color conversion material layer is formed substantially without any voids in the through-hole, and the color conversion material layer is made of a color conversion material and a cured light transmissive resin. The color conversion material layer may also contain the above-mentioned diffusing agent, light scattering agent, glass cloth, fillers, etc.

The color conversion material can be a material known in this field such as yttrium-aluminum-garnet (YAG)-based phosphors activated by cerium, lutetium-aluminum-garnet (LAG)-based phosphors activated by cerium, nitrogen-containing calcium aluminosilicate ($CaO—Al_2O_3—SiO_2$)-based phosphors activated by europium and/or chromium, silicate (($Sr, Ba)_2SiO_4$)-based phosphors activated by europium, β-SiAlON phosphors and KSF-based phosphors ($K_2SiF_6$:Mn). It may also be a crystallized or sintered phosphor, a sintered composite of a phosphor and an inorganic material, or the like. This allows obtaining a light emitting device that emits mixed color light (such as white light) that is a mixture of primary and secondary light of a visible wavelength, or a light emitting device that emits secondary light of a visible wavelength when excited by primary light such as ultraviolet light.

Further, examples of the color conversion material include a luminescent material referred to as a so called nanocrystal or quantum dot, which is nano-size high-dispersive particles of semiconductor materials, for example group II-VI, group III-V and group IV-VI semiconductors, more specifically ZnS, CdS, CdSe, $InAgS_2$, $InCuS_2$, core-shell type $CdS_X—Se_{1-X}$/ZnS, and GaP. The color conversion material may also be, InAs InP, InAsP, InGaP, ZnTe, ZnSeTe, ZnSnP, or $ZnSnP_2$.

In this embodiment, a color conversion material with which there are disadvantages in terms of heat resistance, water resistance, and environmental gas resistance can be used effectively. More specifically, a color conversion material that is vulnerable to heat and/or moisture generated by the processing involved in assembly of the light emitting device discussed below, such as a KSF phosphor that may be readily degraded by water of a dicer, and quantum dots that are susceptible to heating during reflow, can be effectively used without impairing its characteristics, etc. That is, the light-transmissive member including the color conversion material can be cut in advance with a laser or the like to adjust the size of the pieces, and these are directly fixed to individual light emitting elements, or fixed to the light emitting elements after the light emitting devices including the light emitting elements have been mounted on a secondary mounting substrate by reflow, etc., which allows the color conversion material to be effectively provided impairing its characteristics, etc.

In particular, in the case where the light emitting device is used for the backlight of a liquid crystal display, etc., it is preferable to use a color conversion material that is excited by blue light and emits red light (such as a KSF-based phosphor) and a color conversion material that is excited by blue light and emits green light (such as a beta-SiAlON phosphor). Using such materials allows for expanding the color reproduction range of the display in which the light emitting device is used. In particular, KSF has a sharper peak of the emission spectrum than other color conversion materials which emits red color such as CASN or SCASN. Thus, in the case where light is extracted through a color filter used in the display device, amount of red light with low luminosity factor can be decreased, and there will be less lights that go through a (such as green) color filter of other color. As a result, green light and red light of higher color purity can be obtained, and the color reproducibility of the liquid crystal display can be improved.

The color conversion material may be used in any form, such as a pulverized form, spherical form, or hollow or porous granules. A particle of the color conversion material preferably has a median particle size of 50 μm or less, more preferably 30 μm or less, even more preferably 10 μm or less, or a corresponding size. The median particle size refers to a particle size obtained by an air permeability method in F.S.S.S.No (Fisher Sub Sieve Sizer's No).

The color conversion material is preferably contained in an amount of about 10 to 90 wt % with respect to the total weight of the color conversion material layer.

The light-transmissive resin that constitutes the color conversion material layer can be selected from among the above-mentioned resins that are light-transmissive resins. Of these, it is preferable to select one with less expansion and shrinkage during curing or under temperature changes. Also, in the case where a resin is used as a material of the light reflective sheet, it is preferably to use the same resin as that of the light reflective sheet. This can ensure good adhesion between the light-reflective sheet and the color conversion material, and allows the light-transmissive member to be manufactured stably.

Using the light-transmissive member such as this allows for improving visibility of the light emitting device. That is, disposing the color conversion material layer in the through-hole formed in the light reflective sheet, or in other words, disposing the color conversion material layer so as to be completely surrounded by the light reflective sheet, allows for improving a distinct boundary between the light emission region and the non-emission region of the light emitting device simply, easily, and precisely.

In particular, in the case of using a color conversion material that tends not to absorb light, or in which optical absorption tends to decrease, is used in the color conversion material layer, it will be necessary to increase the proportion of the color conversion material in the color conversion material layer, or to make the color conversion material layer relatively thicker in order to ensure the proper amount of the color conversion material. Even in the case where a light-transmissive resin contains a relatively large amount of the color conversion material, or even in the case where film thickness control is required to ensure the proper amount of color conversion material, the above mentioned configuration allows these requirements to be met with case, and thus allows a high-quality light-transmissive member to be obtained, which can be used in the manufacture of a high-quality light emitting device.

Functional Film

A processing may be performed on an upper surface and and/or a lower surface of the light-transmissive member, and particularly on the upper surface and/or lower surface of the color conversion material layer, to protect from humidity and corrosive gas, or to enhance their strength, etc. More specifically, the protective processing is to dispose one or more functional films having the function of protection, moisture-proofing, reinforcement, or the like as a single layer or multilayered structure (see the light-transmissive member 10L in FIG. 8).

For example, as long as it is light-transmissive, this functional film can be formed from the above-mentioned resin that constitutes the light reflective sheet, etc. A filler or the like may be added to the resin for the sake of reinforcement, etc. More specifically, examples include a film of $Al_2O_3$, SiOx, or the like with high gas barrier properties, and epoxy resins, silicone epoxy hybrid resins, fluororesins, parylene-based gas barrier films, and so forth.

Also, the light-transmissive member, and particularly a single light-transmissive member having a single color conversion material layer, can be small, so a sheet of glass or the like may be disposed on the upper surface of the light-transmissive member to ensure the strength of the light-transmissive member, or the upper surface may be coated with a light-transmissive resin or the like, or further processing may be performed for the sake of reinforcement.

First Method for Manufacturing Light-Transmissive Member

The light-transmissive member can be manufactured by the following steps.

(a) Preparing a sheet;
(b) forming a through-hole in this sheet;
(c) imparting a light reflecting function to the sheet; and
(d) filling the through-hole with a light-transmissive resin that contains a color conversion material, and curing the resin to form a color conversion material layer.

In addition, the following steps can be optionally included.

(e) Cutting the sheet for each through-hole or each group of through-holes;
(f) forming a functional film; and
(g) sorting the color or light flux according to the light conversion ability of color conversion material layers in the through-holes on the sheet.

(a) Sheet Preparation

First, a sheet is prepared.

The sheet here, as discussed above, may be formed from a light reflective material, or may be formed from a material other than a light reflective material, such as a light-transmissive material or a light absorbing material.

The sheet can be formed by using a method that is known in the field of plastic molding, such as injection molding, extrusion molding, heat molding, or compression molding.

(b) Formation of Through-Hole

A through-hole is formed in the sheet. The through-hole may be formed by using any method known in this field. Examples of the method include laser light irradiation or delineation, punching, stamping, etching, and blasting.

In particular, through-hole can be formed with good precision by irradiation with a laser beam. A fundamental wave, double wave, triple wave, quadruple wave, or the like of a $CO_2$ laser or a solid state laser can be used for this laser. As to the wavelength, a wavelength in infrared region is preferable.

After the formation of the through-hole, it is preferable to remove any scorching, smears, or the like by washing.

Also, in the preparation of the sheet in step (a), the sheet preparation and the through-hole formation may be performed simultaneously, such as by using a metal mold having a recess and a protrusion that corresponds to the through-hole to form a light reflective material, a light-transmissive material, or a light absorbing material.

(c) Imparting of Light Reflecting Function to Sheet

A light reflecting function may be imparted to the sheet during the formation of the sheet, so that the sheet can be a light reflective sheet. That is, steps (a) and (c) may be performed at the same time. Also, a light reflecting function may be imparted separately to the sheet after the through-hole have been formed (step (b)) in a sheet made of a material other than a light reflective material.

In the case where the impaction of a light reflecting function to the sheet is performed simultaneously with the formation of the sheet, then the sheet should be formed from a light reflective material (the first light reflective material), as discussed above. In this case, for example, a method in which a metal or a dielectric material is formed as the sheet, a method in which a material containing one of the above-mentioned light reflective substances in a light-transmissive resin, an inorganic material, glass, or the like is molded in the form of a sheet, or a method in which the surfaces of the metal or dielectric material, or the sheet including the above-mentioned light reflective substances in a light-transmissive resin are covered by a metal or a light reflective substance can be used.

In the case where a light reflecting function is imparted to the sheet after the formation of the through-hole, an example of how this is performed includes to cover the surface of the sheet and the inner surfaces of the through-hole with a light reflective material by any method known in this field, such as plating, various kinds of molding, spraying, injection, vapor deposition, inkjet printing, or by using ALD method. The light reflective material used for the covering is preferably as thin as possible. The thickness of the light reflective material covering is, for example, preferably equal to or less than about a few dozen microns.

Even in the case where the formation of reflective side walls of the light emitting device is physically difficult due to the small size of the light emitting device, utilizing the sheet to which a light reflecting function can be easily imparted allows to introduce or distribute the light from the light emitting device to where it is needed. As a result, the light utilization efficiency can be increased.

(d) Formation of Color Conversion Material Layer

The insides of the through-hole are filled with a light-transmissive resin that contains a color conversion material, and this resin is cured to form a color conversion material layer.

Any method known, in this field can be used to fill the through-hole with the light-transmissive resin that contains a color conversion material, such as potting, molding, printing, spraying, and various other such methods. In this step, the filling is preferably performed so that after the light-transmissive resin is cured, the upper surface of the color conversion material layer will be in the same plane with the upper surface of the light reflective sheet.

The curing of the light-transmissive resin can be suitably set according to the type of resin being used. Examples include a method of leaving the resin is allowed to stand for a specific length of time, a method of blowing cold air against the resin, a method of heating the resin (very approximately from around several dozen ° C. up to around a hundred and several dozen ° C.), and a method of irradiating the resin with an energy beam (X rays, ultraviolet rays, visible light rays, etc.).

When a plurality of color conversion material layers are formed on a single sheet, the same color conversion material need not be used for all of the color conversion material layers, and a number of different color conversion materials may be used. In this case, RGB color emission can be achieved using a single light-transmissive member by regularly arranging the layers for each color of the color conversion materials.

(e) Cutting of Sheet

In the case where a plurality of through-holes are thrilled in the sheet in step (a), and a plurality of color conversion material layers are formed in step (d), the light reflective sheet may be cut after step (d). The cutting of the sheet may be performed in any way as long as a sheet, and particularly a light reflective sheet, is disposed around substantially the entire outer periphery of the color conversion material layer.

The cutting may be performed so that one color conversion material layer is disposed in one sheet. For example, the light reflective sheet may be cut to a size of about a few tenths of a micron to a few millimeters.

Also, the light reflective sheet may be cut so that a plurality of color conversion material layers are disposed in a single light reflective sheet. In this case, for example, it is preferable for the color conversion material layers to be cut so that the plurality of color conversion material layers in groups of about 5 to 20, and more preferably in groups of about 7 to 15, and even more preferably in groups of about 8 to 12, are disposed in the single light reflective sheet. These color conversion material layers are preferably arranged in a single row, and the light reflective sheet is cut, for example, to a length of about a few tenths of a micron to 5 cm, and preferably about a few tenths of a micron to a few centimeters.

The cutting method can be suitably selected depending on the characteristics of the color conversion material, filler, and resin material being used. This cutting can be performed by any sheet cutting method known in this field, such as blade dicing, laser dicing, or cutter scribing. For instance, in the case of using a color conversion material that is not resistant to moisture, it is preferable to select laser dicing. In the case of using a color conversion material that is not resistant to heat, it is preferable to select blade dicing. In the case where the material is resistant to neither moisture nor heat, the color conversion material can be prevented from being directly exposed to moisture and/or heat, as long as the color conversion material layer is not cut directly. Also, since the light-transmissive member is in the form of a sheet, additional processing of a protective film or other such functional film can be easily carried out.

Second Method for Manufacturing Light-Transmissive Member

The light-transmissive member can also be manufactured by the following steps.

(d') A color conversion material layer is formed by curing a light-transmissive resin that contains a color conversion material; and (a') a resin layer having a light reflecting function is formed as a sheet or a multilayered structure on the outer peripheral side surface of the color conversion material layer.

(d') Formation of Color Conversion Material Layer

In the formation of the color conversion material layer, the material that forma the above-mentioned color conversion material layer is formed as islands on a support sheet by potting, printing, spraying, or any of various other such methods. To form the color conversion material layer in the islands shape, a mask or the like having openings at the sites where the color conversion material layer is to be formed can be utilized. A self-alignment effect can also be used, which takes advantage of hydrophilicity and water repellency between the material for the color conversion material layer and the support sheet. Just one color conversion material layer may be formed, or two or more may be formed. In the case of forming more than one color conversion material layers, the color conversion material layers are preferably formed separated from one another.

(a') Formation of Sheet

The material constituting the above-mentioned sheet can be used as the material that constitutes the resin layer to be made in the form of a sheet-like shape or a multilayered structure. This material is, for example, melted or dissolved in a solvent to be fluid, and then is formed into a sheet-like shape or a multilayered structure so as to surround the side surface of the color conversion material layer. The side surface of the color conversion material layer here is preferably surrounded entirely.

In the case where a plurality of color conversion material layers are formed in the previous step, the entire outer peripheral side surface of the light reflective sheet is preferably formed integrally with some or all of these color conversion material layers.

The material constituting the above-mentioned resin layer is preferably the above-mentioned light reflective material, but it is sufficient that a light reflecting function is imparted to the resin layer in the end. For imparting light reflectivity, in the case where a material which is not light reflective is used as the material that forms the resin layer, for example, then as mentioned above, it is preferable for the side surface, and preferably the entire side surfaces of the resin layer to be covered with a metal or another light reflective substance by any method known in this field, such as plating, spraying, vapor deposition, printing, or ALD.

For example, in the case where spraying is performed, a silicone resin containing a high concentration of titanium dioxide is sprayed directly onto a color conversion material layer made in the island shape, after which a silicone resin containing a low concentration of titanium dioxide may be subjected to compression molding and may be made into a sheet. Optionally, a surface of the side that has been sprayed with titanium dioxide may be ground with a grinder to remove the layer containing the titanium dioxide. That is, a resin layer having a light reflecting function may be formed as a multilayered structure on the outer peripheral side surface of the color conversion material layer.

Except for above-mentioned steps, all the steps can be performed in a way similar to the first method for manufacturing a light-transmissive member, and optional steps as below may be added.

(f) Formation of Functional Films

Further, the above-mentioned functional films may be formed. These films can be formed by using ALD method, sputtering, vapor deposition, CVD, or another such method.

(g) Sort According to Color or Light Flux

An optical conversion performance of the color conversion material layer formed in the through-hole may be measured to be sorted according to color or light flux. After sorting, the sorted light-transmissive member can be mounted on a light emitting element that emits light of a particular wavelength, in a state in which the light-transmissive member has been made into individual units or not-individualized unit, either before or after step (e). Consequently, a higher yield of the light emitting device can be anticipated, especially in the case where the light flux or color is measured in a slate before individualization in advance.

Method for Manufacturing Light Emitting Device

The light emitting device can be formed by:
(A) fixing the above-mentioned light-transmissive member on a light emitting element so that the color conversion material layer is disposed on the light emitting element; and
(B) covering side surfaces of the light emitting element with a light reflective member.

Steps (A) and (B) are preferably performed in the above order, but may instead be performed simultaneously or in reverse order. Also, a light emitting element may preferably be mounted on the substrate of the light emitting device before or after step (A), and particularly preferable before step (A). A single light emitting element may be mounted on a single substrate, or a plurality of light emitting elements may be mounted on a plurality of substrates, or a plurality of light emitting elements may be mounted on a single substrate.

Furthermore, in case where a plurality of light emitting elements are mounted on a single substrate, a step of separating them for each light emitting device or a group of light emitting devices may be performed after step (B). That is, the light emitting element whose side surfaces are covered by a light reflective member, or the light emitting element and the light-transmissive member, whose side surfaces are covered by a light reflective member may be made into individual units.

The damage on the color conversion material, etc., in the assembly process of the light emitting device can be minimized in the case where step (B), the step of separation by light emitting device, and step (A) are performed in that order.

As discussed below, the light emitting element used here may be mounted on a substrate with terminals.

(A) Fixing of Light-Transmissive Member and Light Emitting Element

The light-transmissive member formed by the method discussed above is fixed to the upper surface of the light emitting element. That is, the light-transmissive member is disposed on the light extraction surface side of the light emitting device. A portion of the upper surface of the light emitting element is preferably in direct contact with the light-transmissive member, and more preferably is firmly adhered to the light-transmissive layer.

There may be just one, or two or more of the light-transmissive members used in this step. Also, there may be just one, or two or more of the light emitting elements used in this step. That is, the light emitting device manufactured in this method may include just one light emitting element, or may include two or more. A configuration such as this allows the number of the light emitting elements and the combination of turned-on/turned-off of the light emitting elements to be selected, and allows light distribution and emission color of the light emitting device to be controlled in various ways.

A single light-transmissive member may be fixed to the upper surface of a plurality of light emitting elements, but from the standpoint of ensuring good visibility, it is preferable that a single light-transmissive member, and particularly a single color conversion material layer, is fixed on a single light emitting element. This can effectively prevents light from leaking in unintended directions from the light emitting element. As a result, visibility can be further improved in individual light emitting elements by the simple manufacturing method discussed above.

Also, in the case where a plurality of light emitting elements are mounted on a substrate, a light-transmissive member on which a plurality of color conversion material layers are disposed at positions corresponding to the light emitting elements are preferably fixed collectively on these light emitting elements.

The light emitting element used here can be any light emitting element that is commonly used in this field. Examples of blue and green light emitting elements include those made of ZnSe, nitride semiconductors ($In_XAl_YGa_{1-X-Y}N$, $0 \leq X$, $0 \leq Y$, $X+Y \leq 1$), GaP, or other such semiconductor layers, while examples of red light emitting elements include those made of GaAlAs, AlInGaP, and other such semiconductor layers.

The light emitting element is can be formed by stacking a semiconductor layer over an insulated substrate used for semiconductor growth, such as sapphire, but this semiconductor growth substrate may also be removed during forming of the light emitting element.

The light emitting element may be one in which electrodes are disposed on opposite sides of the semiconductor layer, but is preferably one in which the electrodes are disposed on the same side. This allows for face-down mounting (flip-chip mounting) in which the electrodes are joined to the substrate. The light emitting element may have a face-down structure that has a growth substrate, a face-down structure that does not have a growth substrate, a face-up structure that has a growth substrate, a face-up structure that does not have a growth substrate, or the like.

Figure 5A:
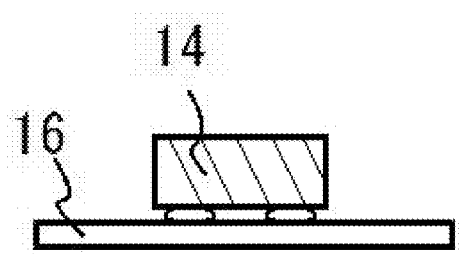
FIGS. 5A to 5C are schematic manufacturing step diagrams showing the method for manufacturing a light emitting device according to an embodiment of the present invention.
Figure 5B:
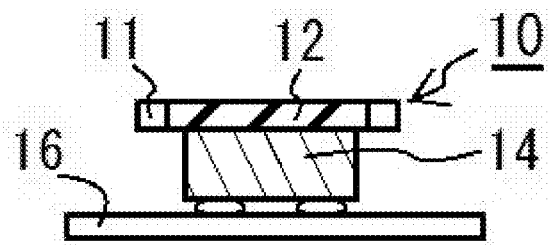
Figure 5C:
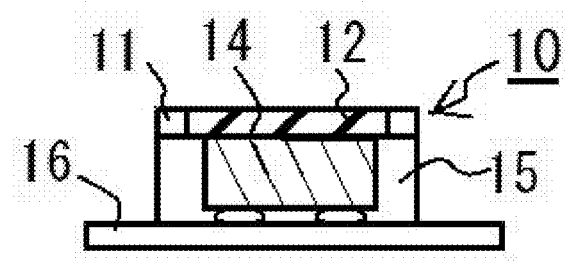

The light emitting element is preferably one that is the same size or smaller than an area defined by outer edges of the color conversion material layer in plan view as shown in FIG. 5C. This allows substantially all of the light emitted from the light emitting element to be efficiently introduced into the color conversion material layer, and thus allows improving the light extraction of the light emitting device. The light emitting element may be also one that is the same size (the outer edges substantially coincide) or larger than the outer edge of the color conversion material layer. Also in this case, covering the side surfaces of the light emitting element with a light reflective member (discussed below) allows a light emitting device with good visibility, uniform emission color, and good light distribution and color to be formed.

Figure 12A:
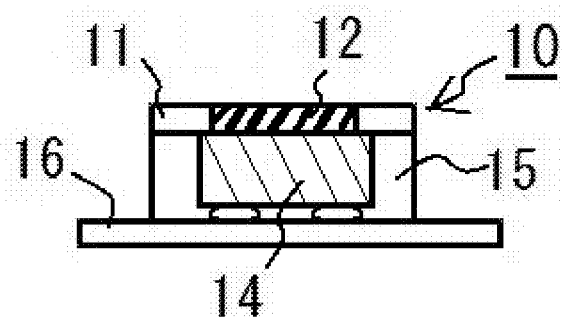
FIGS. 12A to 12C are schematic plan view of a light emitting device according to other embodiment of the present invention.
Figure 12B:
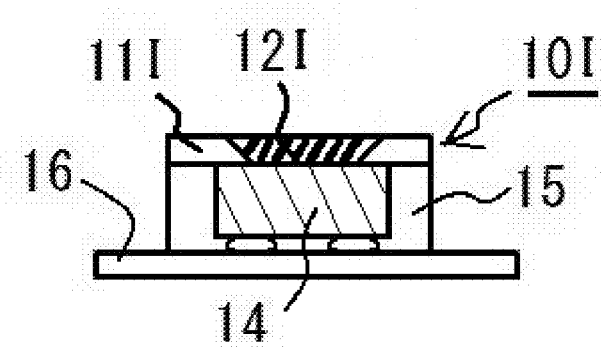
Figure 12C:
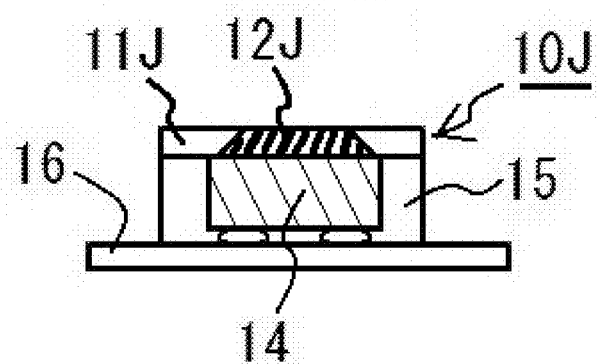

A light emitting element 14 is preferably smaller, than the outer edge of a light-transmissive member 10, as shown in FIG. 5C and FIGS. 12A to 12C. This allows the outer edge of the light-transmissive member to be disposed outside of the outer edge of the light emitting element, and allows a light emitting device with good visibility, uniform emission color, and good light distribution and emission color to be formed. The through-hole in which the color conversion material layer is disposed may be either tapered or reverse tapered from the element side toward the light extraction surface as shown in FIGS. 12B and 12C.

Furthermore, a light emitting element that is larger than the outer edge of the light-transmissive member in plan view may be used. In this case, the side surfaces of the light emitting element and the upper surface of the light emitting element (and optionally the side surfaces of the light-transmissive member) are covered by the light reflective member discussed below, which allows a light emitting device with good visibility, high brightness, uniform emission color, and good light distribution and color temperature to be formed. The through-hole in which the color conversion material layer is disposed is preferably reverse tapered, that is, a width of the through-hole is decreased from the element side toward the light extraction surface.

The fixing of the light transmissive member to the upper surface of the light emitting element can be accomplished by using a light-transmissive adhesive member, for example. Any adhesive member can be used, so long as it ensures the above-mentioned light-transmissivity and can fix the light-transmissive member to the light emitting element. A material that is not readily degraded by light is preferable as the light-transmissive adhesive member. Examples of the material include silicone adhesives, epoxy adhesives, and silicone-epoxy hybrid adhesives.

The color conversion material layer or sheet surface can be utilized as the adhesive member itself. That is, the color conversion material layer or the light reflective sheet itself may be given adhesive properties, or the adhesion of the color conversion material layer or sheet may be utilized.

The adhesive member can be formed in a fillet shape that expands from the outer edge of upper surface of the light emitting element to the lower surface of the outer edge of the light-transmissive member in the case of using a light emitting element whose outer edge is smaller than that of the light-transmissive member in plan view. Also, the adhesive member can be formed in a fillet shape that expands from the outer edge of the lower surface of the light-transmissive member to the outer edge of the upper surface the light emitting element in the case of using a light emitting element whose outer edge is larger than the light-transmissive member in plan view. From the standpoint of forming a light emitting device with good visibility, it is preferable for the outer edge of the adhesive member to be disposed more to the inside than the outer edge of the light-transmissive member, or for the outer edge of the adhesive member to be covered by a light reflective member, as discussed below.

The light-transmissive member may also be mounted mechanically on the light emitting element by utilizing a processed surface, texturing on the light reflective sheet that is simultaneously processed in the formation of the above-mentioned through-holes, or the like to fit, partially bond, etc., to the structure of the light emitting element, the light emitting device, and a light source or other such device that emits light.

As discussed above, the light emitting element is preferably mounted on a substrate. There are no particular restrictions on the substrate here, which may be a substrate having a pair of positive and negative terminals for mounting a single light emitting element, or may be a substrate having a wiring pattern for mounting a plurality of light emitting elements.

the substrate include, for example, an insulated base, on the surface of which are formed conductive terminals or a wiring pattern. The materials that form the base and the terminals or the wiring pattern, their shape, size, and so forth can be suitably selected according to the configuration of the light emitting device to be obtained.

The light emitting element may be mounted in the face-up mounting, in which the growth substrate side of the light emitting element the opposite side from the side where the electrodes are formed) is joined on the substrate, but flip chip mounting (face down mounting) on the substrate is preferable.

In the case of face-up mounting, for example, the above-mentioned light-transmissive adhesive member (resin, etc.) can be disposed on the light emitting element so that a portion of the wires is embedded and the light-transmissive member is disposed over this. Also, as will be discussed below, a side surface of a light-transmissive part of the light emitting element, such as sapphire, can be covered with a light reflective member in step (C) and before the mounting of the light-transmissive member in order to improve light extraction from the upper surface of the light emitting element. A made of transparent material with a tapered shape may be provided between the light-reflective member and the transparent the light-transmissive part of the light emitting element.

The light emitting element can be mounted on the substrate via a joining member. Examples of the joining member here include solders such as those based on tin-bismuth, tin-copper, tin-silver, gold-tin, or the like; alloys whose main components are gold and tin, alloys whose main components are gold and germanium, and other such eutectic alloys; silver, gold, palladium, and other such conductive pastes and bumps; ACP, ACF, and other such anisotropic conductive materials low-melting point metal brazes; conductive adhesives that are a combination of these; and conductive composite adhesives.

In the case of flip-chip mounting, the electrodes of the light emitting element can be directly connected to the wiring pattern of the substrate via these materials.

In the case where one or a plurality of light emitting elements are mounted on a plurality of substrates, a plurality of light-transmissive members may be arranged on a single support prior to step (A), or instead of this arrangement, a light-transmissive member equipped with a plurality of color conversion material layers may be used.

As the support, it is preferable to use a detachable pressure-sensitive adhesive tape or sheet, a temporary fixing agent for a semiconductor, a patternable temporary fixing agent, or the like. Using the support allows the plurality of light-transmissive members to be simultaneously mounted on and fixed to the plurality of light emitting elements. As a result, the manufacturing process can be simplified. The manufacturing process can also be simplified by using a light-transmissive member including a plurality of color conversion material layers.

A printed wiring board, a printed circuit board, or the like including wirings wired for the mounting of an LED, ZD, or any of various other components for lighting applications that can actually it used as a light source, can also be used as the support.

(B) Covering with Light Reflective Member

The side surfaces of the light emitting element are covered with a light reflective member.

The light reflective member can be made of the light reflective materials discussed above. In particular, in terms of simplicity and ease of covering, it is preferable to use a light reflective substance contained in a resin or an inorganic material. The resin can be selected from among the above-mentioned thermosetting resins, thermoplastic resins, modified resins of these, and hybrid resins that contain one or more of these resins. Of these, the use of a light-transmissive resin is preferable, and from the standpoint of adhesion to the light-transmissive member, etc., it is preferable to use the resin that constitutes the light-transmissive member, and particularly a resin that is the same as the material constituting the light reflective sheet.

As long as it covers the side surfaces of the light emitting element, the light reflective member may cover indirectly, via a space, etc., but is preferably disposed directly, that is, so as to be in contact with the side surfaces of the light emitting element. Covering in this way allows the light emitted from the light emitting element to be distributed more efficiently in a particular direction.

The side surfaces of the light emitting element that are covered may be just some of these surfaces, but are preferably all the side surfaces. The phrase "side surfaces of the light emitting element" here means, for example, the side surfaces of the semiconductor layer constituting the light emitting element, but in the case of disposing electrodes, then the light reflective member may be disposed on the side surfaces of the electrodes.

Also, as discussed above, since the light emitting element can be mounted on a substrate, and in that case, the light reflective member preferably covers the side surfaces of the light emitting element and a surface of the substrate. Furthermore, in the case where there is a space between the semiconductor layer and the substrate, then this space may be covered or filled in by the light reflective member. At all of these locations (that is, the side surfaces of the semiconductor layer, the electrode side surfaces, and between the semiconductor layer and the substrate), the same material or different materials may be used as the light reflective member.

In the case of using a material that is the same as the material constituting the above-mentioned light-transmissive member as the light reflective member, the side surfaces of the light emitting elements can be covered by using a method such as potting, transfer molding, compression or molding. These methods can facilitate to cover the side surfaces of the light emitting element. Also, the light reflective member can be easily, securely, and accurately disposed only under the light-transmissive member. In particular, in the case of performing step (B) after step (A), the side surfaces of the light emitting element can be covered by the light reflective member so that the upper surface of the light reflective member and the lower surface of the light-transmissive member coincide easily and securely.

Also, the side surfaces of the light emitting element and the side surfaces of the light-transmissive member can be covered so that the upper surface of the light reflective member coincides with the upper surface of the light-transmissive member.

In the case where a material that is the same as the material constituting the above-mentioned light-transmissive member (such as a resin same as the resin used for the light-transmissive member) is used as the light reflective member, these light emitting elements can be simply covered all at once and integrally by the light reflective member on the substrate on which the light emitting elements are arranged.

A molded article in which the location corresponding to the light emitting element is hollow may be used as the light reflective member. In this case, the light reflective member with a form of the molded article may be disposed on the substrate in advance, after which a light emitting element to which a light-transmissive member has been fixed may be disposed on the light reflective member and pressure, applied so that the electrodes of the light emitting element come into contact with the wiring of the substrate. The molded article preferably has a height corresponding to the height of the light emitting element. This allows facilitating to cover the side surfaces of the light emitting element by the light-reflecting member, and also allows the light reflective member to be disposed easily, securely, and accurately only below the light transmissive member (that is, without covering the side surfaces of the light-transmissive member). Also, the upper surface of the light reflective member can be easily and securely made to coincide with the lower surface of the light-transmissive member. In this case, step (B) can be performed before step (A).

The molded article is preferably fixed to the above-mentioned substrate with an adhesive agent or the like.

After step (B), the light-transmissive member, the light reflective member, and/or the substrate, etc., may or may not be separated for each light emitting element or for each group of light emitting elements, if needed, in the case where a plurality of light emitting elements are mounted on a single substrate, in the case where a single light-transmissive member is fixed on a plurality of light emitting elements, in the case where a plurality of light-transmissive members are fixed on a corresponding plurality of light emitting elements, or in other such cases. This allows obtaining a light emitting device with desired light distribution, brightness, size, and so on. The separation in this case can be performed by using blade dicing, laser dicing, or the like.

Light Emitting Device

The light emitting device according to an embodiment of the present invention mainly includes a light emitting element, a light-transmissive member, and a light reflective member.

The light-transmissive member can be the one discussed above, and is fixed on the light emitting element so that the color conversion material layer is disposed on the light emitting element. The color conversion material layer is preferably in contact with a portion of the upper surface of the light emitting element, and more preferably is firmly adhered.

The outer edge of the light emitting element preferably either coincides with the outer edge of the color conversion material layer in plan view, or is disposed on the inside of the color conversion material layer.

In the case where a single light emitting device includes a plurality of light emitting elements, a light reflective sheet including a plurality of color conversion material layers can be used as the light-transmissive member so that the plurality of light emitting elements are collectively configured by this light-transmissive member.

In a single light emitting device, there may be just one light emitting element or an arrangement of two or more light emitting elements. In the latter case, it is preferable that the light-transmissive member includes a plurality of color conversion material layers, and the color conversion material layer are disposed at positions corresponding to the light emitting elements, and fixed on the light emitting elements. This allows to obtain a light emitting device with good visibility. Also, the color conversion material layers may contain the same color conversion material, or may contain different color conversion materials.

The light emitting element may be mounted on a substrate on which terminals are formed, or may not be mounted. For example, in the case where a single light emitting device includes a plurality of light emitting elements, the light emitting elements can be collectively configured by the substrate on which the terminals are formed.

The upper surface of the light reflective member may coincide with the lower surface of the light-transmissive member, or it may coincide with the upper surface of the light-transmissive member so that the side surfaces of the light-transmissive member are also covered.

Also, in the case where a single light emitting device includes a plurality of light emitting elements, the light emitting elements can be collectively configured by a light reflective member substrate.

A configuration such as this allows a light emitting device to be obtained extremely simply and easily, and very accurately.

In particular, in the case where a color conversion material that tends not to absorb light, or in which optical absorption tends to decrease, or the like is used in the color conversion material layer of the light-transmissive member, it will be necessary to increase the proportion of color conversion material in the color conversion material layer, or to make the color conversion material layer relatively thicker in order to ensure the proper amount of color conversion material. Even in the case where a light-transmissive resin contains a relatively large amount of color conversion material, and even in the case where film thickness control is required to ensure the proper amount of color conversion material, these requirements can be met with ease, and a high-quality light emitting device can be obtained.

The light-transmissive member and the light emitting device according to embodiments of the present invention, and their methods of manufacture, will be described below in detail.

Embodiment 1: Light-Tranmissive Member and Method for Manufacturing thereof

Figure 1A:
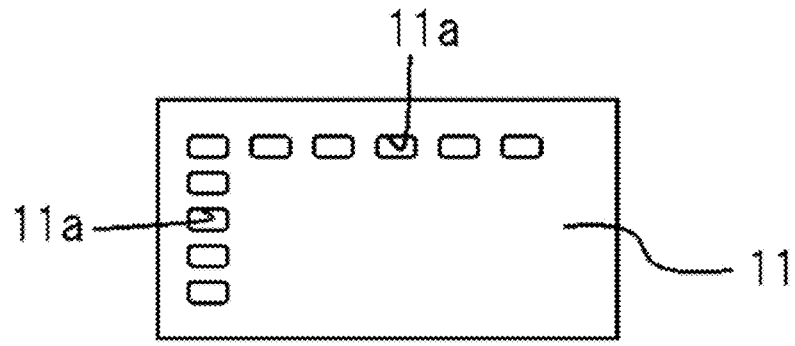
FIGS. 1A to 1D are schematic manufacturing step diagrams showing a method for manufacturing the light-transmissive member according to an embodiment of the present invention.

First, a light reflective sheet 11 is prepared as shown in FIG. 1A.

The light reflective sheet 11 is made of a silicone resin that contains 60 wt % $TiO_2$, which is a light reflective substance, and is formed into a sheet with a thickness of 200 μm.

A plurality of substantially rectangular through-holes 11a that measure 1.1×0.2 mm are arranged in a row and column on this light reflective sheet 11.

Figure 1B:
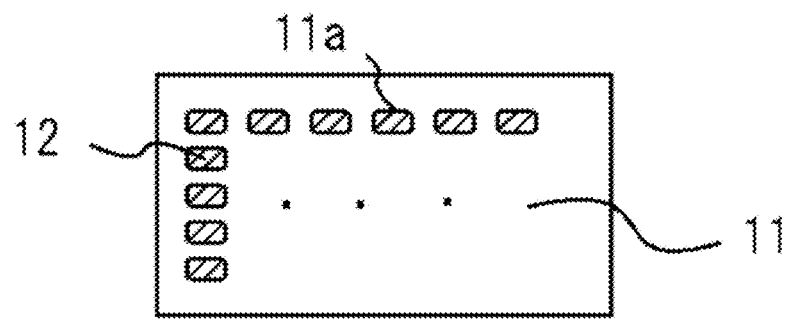

Next, as shown in FIG. 1B, the through-holes 11a are filled by potting with a slurry obtained by mixing 18 wt % KSF phosphor with a particle size of about 20 μm, 26 wt % beta-SiAlON with a particle size of about 12 μm, and 56 wt % light-transmissive resin (silicone resin), and the mixture is cured. The curing of the light-transmissive resin is accomplished by heating at 150° C. for 240 minutes in an oven. This forms a color conversion material layer 12. This color conversion material layer 12 is substantially flush with the light reflective sheet 11, with almost no depression in the center of the through-holes 11a.

Figure 1C:
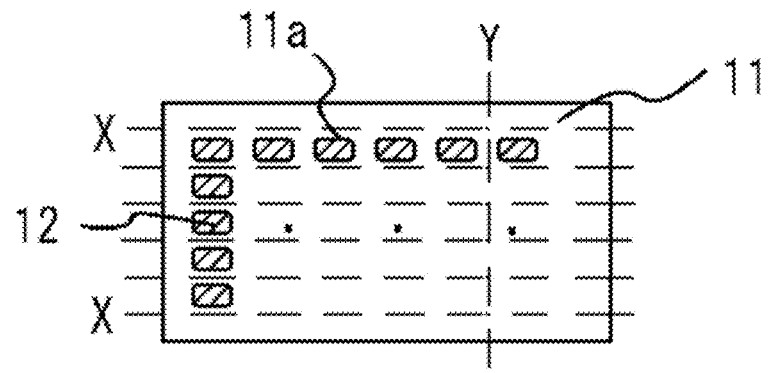
Figure 1D:
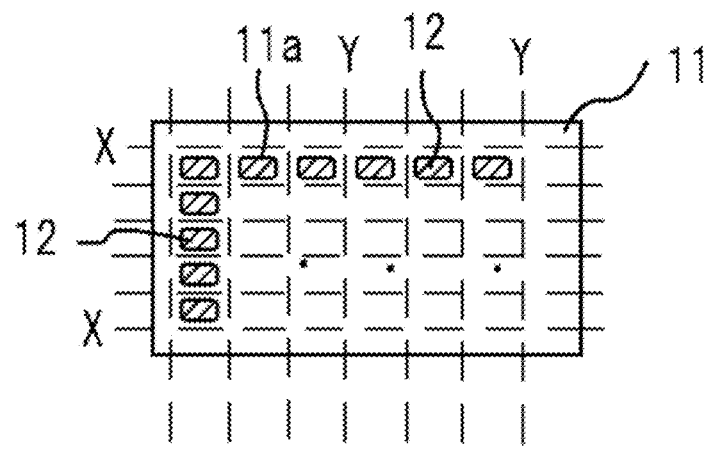

As shown in FIG. 1C, the light reflective sheet 11, including the color conversion material layer 12, is cut in the lengthwise direction X of the light reflective sheet, which gives a light-transmissive member 100 in which five color conversion material layers 12 are arranged in a row as shown in FIG. 2A, for example.

As shown in FIG. 1D, this member can also be cut in the direction Y, perpendicular to the lengthwise direction X, to form individual light-transmissive members 10 that each have one color conversion material layer 12 as shown in FIG. 2B. This individual light-transmissive member 10 is rectangular in top view, measuring 1.8×0.3 mm, for example.

The cutting here is performed with a dicer with a reduced amount of water usage.

In this light-transmissive member 1 the upper surfaces of the light reflective sheet and the color conversion material layer are flush, that is, there is no step between the two upper surfaces. With this structure, the dimensions of the color conversion material layer, and in turn those of the light-transmissive member, can be stabilized, and they can be better assembled to other members.

Modification Example 1: Light-Transmissive Member

Figure 9:
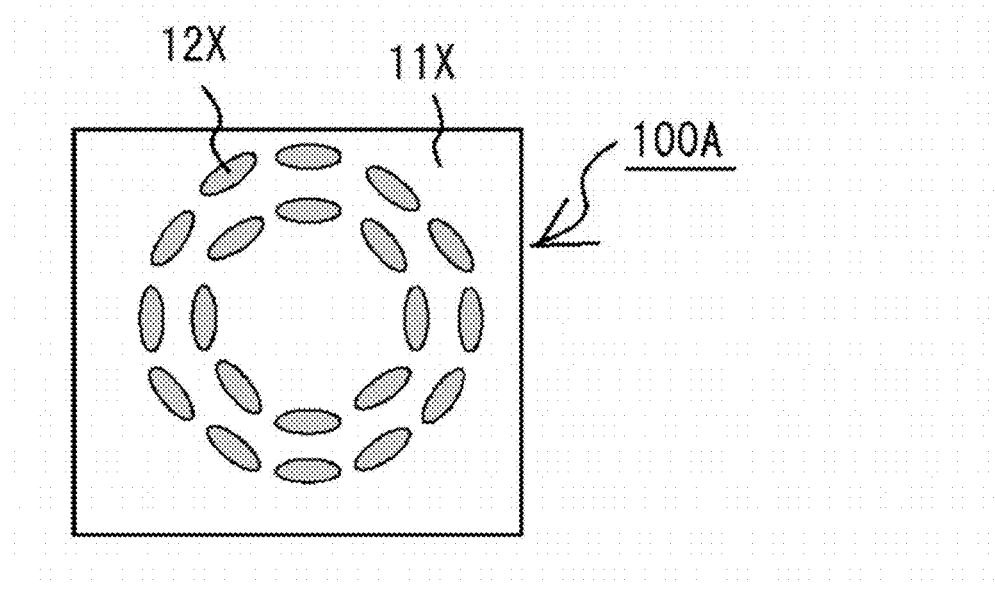
FIG. 9 is schematic plan view of a light-transmissive member according to still other embodiment of the of the present invention.

As shown in FIG. 9, instead of the light-transmissive member 100 shown in FIG. 2A, a plurality of color conversion material layers 12X may be arranged in a ring shape on a single light reflective sheet 11X.

Modification Example 2: Light-Transmissive Member

Instead of the light-transmissive member 10 shown in FIGS. 2B and 2C, color conversion material layers 12A to 12H and 12M may be concave and/or convex with respect to the upper surface and/or lower surface of the light reflective sheet as with the light-transmissive members 10A to 10H and 10M shown in FIG. 8. In the case where the upper surface and/or lower surfaces of the color conversion material layer is concave with respect to the upper surface and/or lower surface of the light reflective sheet, light convergence or other such effects can be exhibited. Also, in the case where the upper surfaces and/or lower surfaces of the color conversion material layers are convex with respect to the upper surface and/or lower surface of the light reflective sheet, an adhesion the light emitting elements being used can be improved. Furthermore, in the case where the shape is convex with respect to the upper surface of the light reflective sheet, light extraction efficiency can be enhanced.

In particular, in the case where the upper surfaces and/or lower surfaces of the color conversion material layers of the light-transmissive member have a curved surface, this is advantageous for use in light-transmissive members with a large surface area and a linear light source.

Modification Example 3: Light-Transmissive Member

As shown by the light-transmissive members 10I and 10J in FIG. 8, through-holes 11aI and 11aJ of a sheet 111 have a shape that is either tapered or reverse tapered from the surface of the light reflective sheet to the lower surface.

Modification Example 4: Light-Transmissive Member

As shown by the light-transmissive member 10K in FIG. 8, the upper surface of the color conversion material layer 12K may have recesses and protrusions in the thickness direction of the light-transmissive member 10K itself that is, a shape of a so-called fly-eye shape, etc. This allows optical coupling efficiency with a light guide plate to be improved, depending on the application of the light-transmissive member, such as a use in a backlight.

Modification Example 5: Light-Transmissive Member

As shown by the light-transmissive member 10L in FIG. 8, a moisture barrier film may be disposed on the upper surface of the light-transmissive member, for example. As shown by the light-transmissive member 10N in FIG. 8, a transparent film may be disposed on the upper surface, for example. This allows preventing degradation of the characteristics of the light-transmissive member in the case of using a color conversion material that becomes brittle when exposed to moisture, or a color conversion material that tends to readily absorb moisture.

Figure 3A:
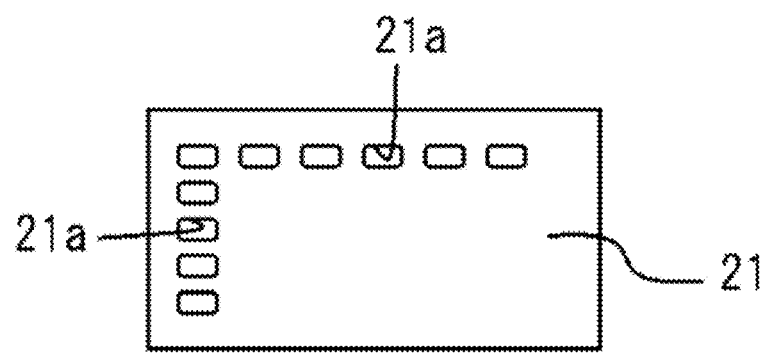
FIGS. 3A to 3D are schematic manufacturing step diagrams showing a method for manufacturing the light-transmissive member according to another embodiment of the present invention.

Embodiment 2: Light-Transmissive Member and Method for Manufacturing thereof First, as shown in FIG. 3A, a sheet 21 that is made of glass epoxy prepreg and has a thickness of 200 μm is prepared. Substantially rectangular through-holes 21a measuring 1.1× 0.2 mm are formed in this sheet 21 by laser processing in a row and column, and desmearing is performed.

Figure 3B:
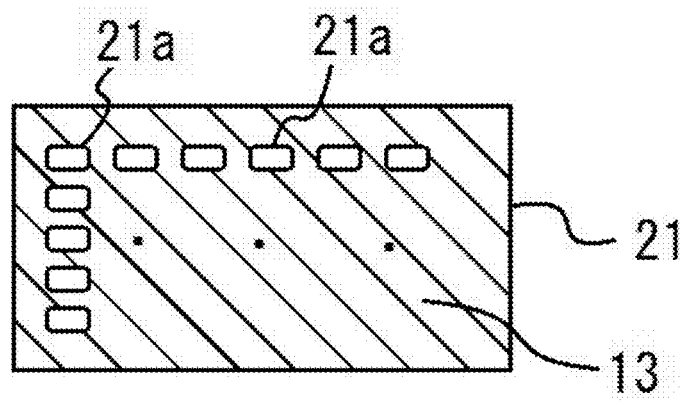

Then, as shown in FIG. 3B, the sheet 21 having the through-notes 21a is immersed in a primer liquid containing palladium microparticles, forming a platable seed layer over the entire sheet surface, after which this is subjected to electroless nickel plating and electrolytic silver plating to form a silver film with a thickness of about a few microns. The "entire sheet surface" here refers to substantially all the side surfaces and the front and back surfaces of the sheet 21 and the inner surfaces of the through-holes 21a.

Figure 3C:
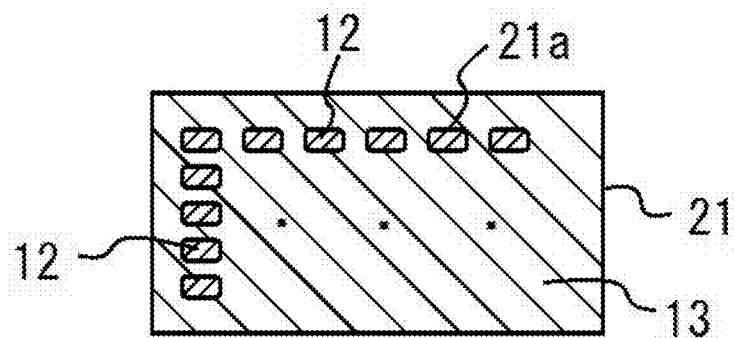

Then as shown in FIG. 3C, the through-holes 21a are filled by potting with a slurry obtained by mixing 20 wt % KSF phosphor with a particle size of about 20 μm, 30 wt % beta-SiAlON with a particle size of about 12 μm, and 50 wt % light-transmissive resin (silicone resin), and the mixture is cured. Accordingly, a color conversion material layer 12 is formed. This color conversion material layer 12 is substantially flush with the light reflective sheet 21, with almost no depression in the center of each of the through-holes 21a.

Figure 3D:
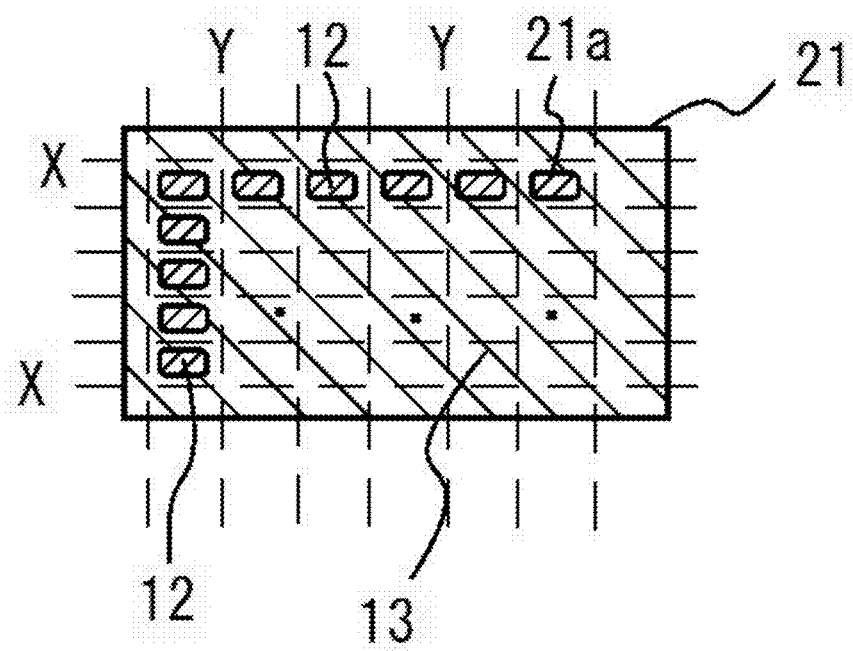
Figure 4:
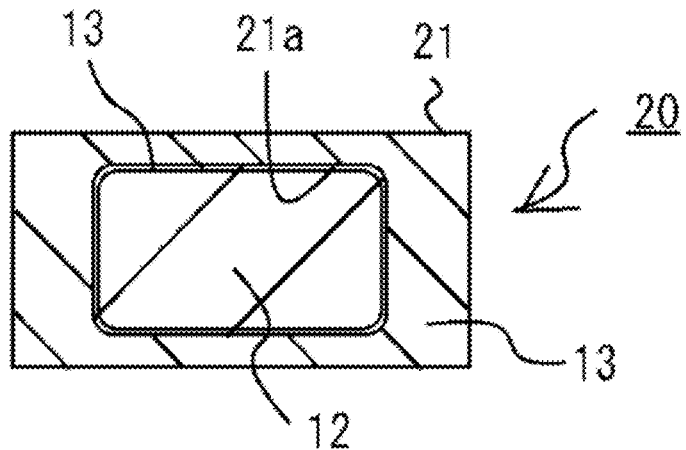
FIG. 4 is schematic plan view showing a light-transmissive member according to still another embodiment of the present invention.

As shown in FIG. 3D, the light reflective sheet 21, including the color conversion material layer 12, is cut in the lengthwise direction X of the light reflective sheet, and in the direction Y, perpendicular to the lengthwise direction X, to form individual light-transmissive members 20 that each have one color conversion material layer 12 as shown in FIG. 4. A light reflective film made of silver is formed on the front and back surfaces of this light-transmissive member 20 and on the inner surface of the through-hole 21a.

Modification Example 6: Method for Manufacturing Light-Transmissive Member

Figure 10A:
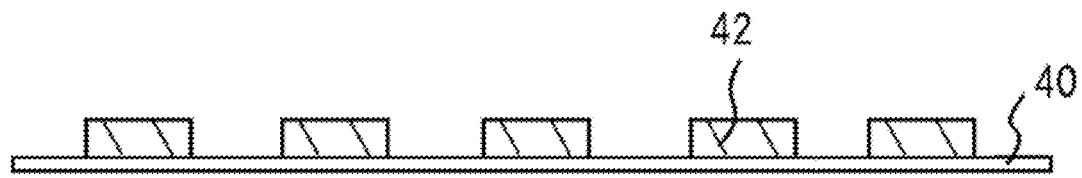
FIGS. 10A and 10B are schematic manufacturing step diagrams showing a method for manufacturing the light emitting device according to other embodiment of the present invention.

As shown in FIG. 10A, color conversion material layers 42 are formed on a support sheet 40, for example. In the present modification example, a plurality of color conversion material layers 42 are formed, and the color conversion material layers 42 are formed in island shapes that are separated from one another.

Figure 10B:
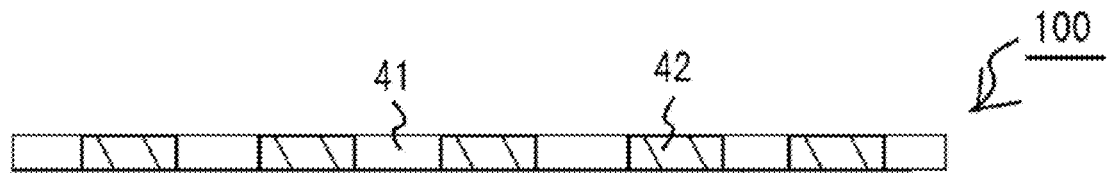

Next, as shown in FIG. 10B, a light reflective resin layer 41 that is made of a silicone resin that contains 60 wt % $TiO_2$, which is a light reflective substance, is compression molded, for example, so as to cover only the entire side surfaces of the color conversion material layers 42. After this, the light-transmissive member 100 can be obtained by removing the support sheet 40. Other than the above, the light-transmissive member is manufactured by the same method as in Embodiment 1. With this method, similar effect as the method for manufacturing a light-transmissive member in Embodiment 1 can be obtained.

Modification Example 7: Method for Manufacturing Light-Transmissive Member

Figure 11A:
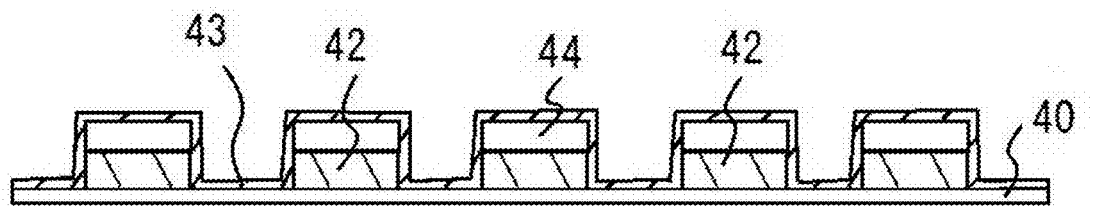
FIGS. 11A to 11C are schematic manufacturing step diagrams showing a method for manufacturing a light emitting device according to still other embodiment of the present invention.

As shown in FIG. 10A, color conversion material layers 42 are formed on the support sheet 40, after which masks 44 are formed on the upper surfaces of the color conversion material layers 42 as shown in FIG. 11A. Then, a light reflective film 43 is formed on the color conversion material layers 42 via these masks 44. As the light reflecting film 43, a film consisting of a silicone resin that contains 80 wt % $TiO_2$, which is a light reflective substance, is formed by spraying, for example.

Figure 11B:
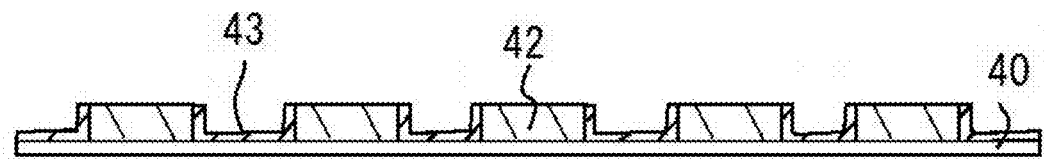

After this, as shown in FIG. 11B, the masks 44 and the light reflective film 43 formed over them are removed by blasting, etc., to expose the upper surfaces of the color conversion material layers 42.

Figure 11C:
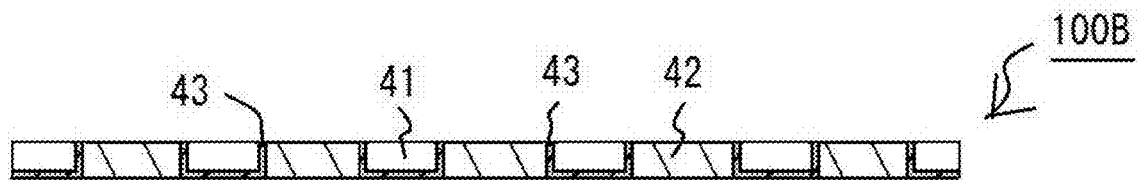

As shown in FIG. 11C, a light reflective resin layer 41 consisting of a silicone resin that contains 30 wt % $SiO_2$, which is a light reflective substance, is formed between the color conversion material layers 42 so as to cover the side surfaces of the color conversion material layers 42.

A light-transmissive member 100B can then be obtained by removing the support sheet 40. In the light-transmissive member 100B, the light reflective film 43 is disposed on one surface of the light reflective resin layers 41 between the color conversion material layers 42, and with the entire side surfaces of the color conversion material layers 42.

Other than the above, the light-transmissive member is manufactured by the same method as in Embodiment 1 and Modification Example 7. With this method, an effect similar to that with the method for manufacturing a light-transmissive member in Embodiment 1 and Modification Example 7.

Embodiment 3: Light Emitting Device and Method for Manufacturing thereof

First, as shown in FIG. 5A, the light emitting element 14 is mounted in face-down mounting on a substrate 16 using solder. The size of the light emitting element 14 is 1100× 200×300 μm, for example. The outer shape of the upper surface of the light emitting element 14 has the same size as or slightly smaller than that of the outer shape of the color conversion material layer 12 of the light-transmissive member 10.

As shown in FIG. 5B, the light-transmissive member 10 obtained in Embodiment 1 is disposed on the upper surface of the light emitting element 14, and fixed with a light-transmissive adhesive member. The light-transmissive member 10 is fixed on the light emitting element 14 so that the outer edge of the color conversion material layer 12 will be disposed slightly to the outside of the outer edge of the light emitting element 14.

As shown in FIG. 5C, a light reflective member 15 in a form of liquid is then deposited below the light-transmissive member 10, and its fluidity is utilized to cover the entire side surfaces of the light emitting element 14 with the light reflective member 15.

The light reflective member 15 is made of a silicone resin that contains 2 to 2.5 wt % silica and 40 to 50 wt % titanium oxide.

The light reflective member 15 is disposed only under the light-transmissive member 10, and its upper surface coincides with the lower surface of the light-transmissive member 10. The light reflective member 15 also covers or fills the space between the light emitting element 14 and the substrate 16. With this structure, the light emitted from the light emitting element 14 toward the substrate 16 can be guided to the light-transmissive member 10 that is not covered by the light reflective member 15. As a result, a light emitting device with good visibility can be obtained.

Embodiment 4: Light Emitting Device and Method for Manufacturing thereof

Figure 6A:
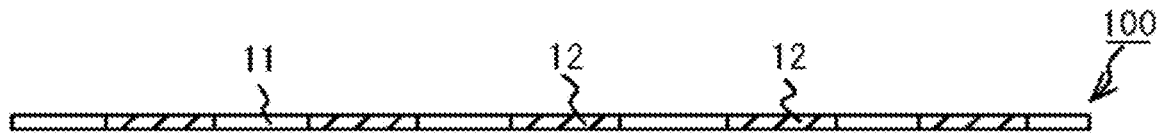
FIGS. 6A to 6E are schematic manufacturing step diagrams showing a method for manufacturing the light emitting device according to an embodiment of the present invention.

First, as shown in FIG. 6A, the light-transmissive member 100 obtained in Embodiment 1, including a plurality of color conversion materials layers 12 as shown in FIG. 2A, is prepared.

Figure 6B:
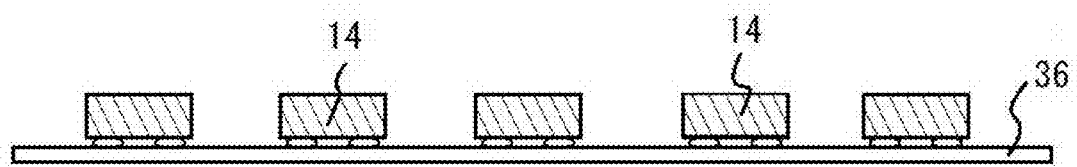

Then, as shown in FIG. 6B, a plurality of the light emitting elements 14 are mounted in a regular arrangement on a substrate 36 so as to correspond to the positions of the color conversion material layers 12 of the light-transmissive member 100.

Figure 6C:
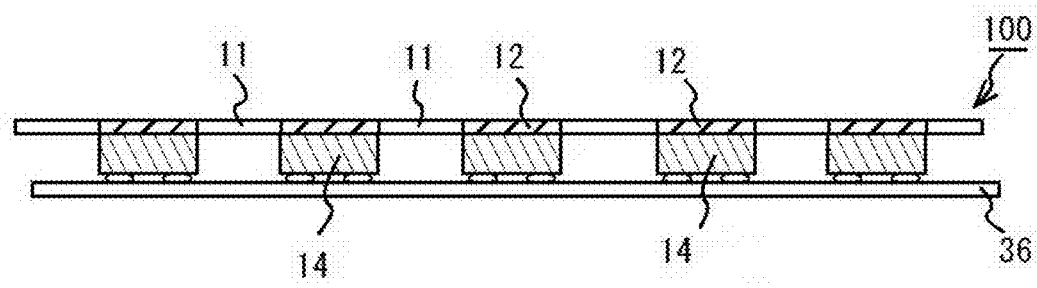

Next, as shown in FIG. 6C, the light-transmissive member 100 is disposed on the light emitting elements 14, and fixed, so that the outer edges of the color conversion material layers 12 will be disposed to the outside of or coincide with the outer edges of the light emitting elements 14.

Figure 6D:
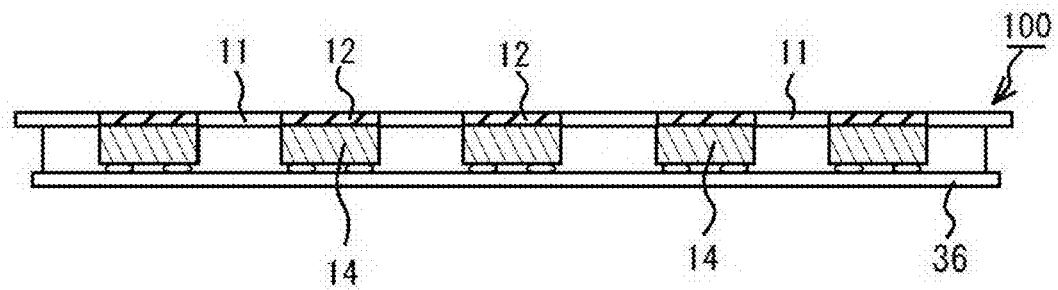

Then, as shown in FIG. 6D, the light reflective member 15 in a form of liquid is deposited under the light-transmissive member 100 and between the light-transmissive member 100 and the substrate 36 to integrally cover the entire side surfaces of the light emitting elements 14 utilizing the fluidity of the light-reflective member 15.

This allows a light emitting device to be obtained in which five light emitting elements are arranged in a row.

Figure 6E:
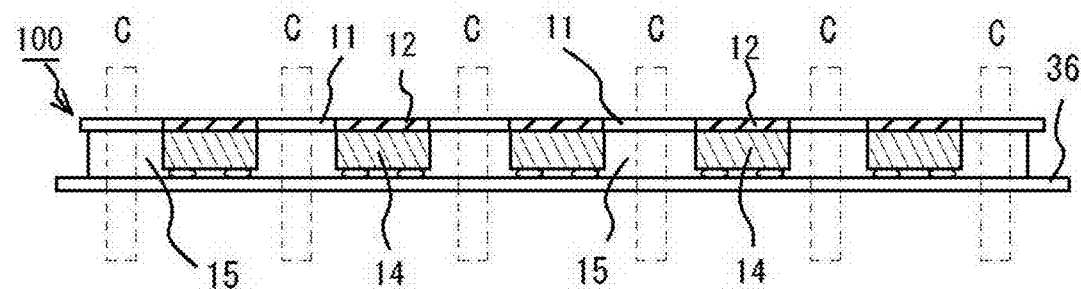

As shown in FIG. 6E, the light reflective sheet 11 of the light-transmissive member 100, the light reflective member 15, and the substrate 36 are cut at cutting positions C by a dicer so that the side surfaces of the light reflective member 15 will be exposed, and thus an individualized light emitting device with a light emitting element can be obtained.

The manufacturing method discussed above allows a light-transmissive member and a light emitting device to be manufactured easily and accurately.

Also, regardless of the number of light emitting elements mounted, the resulting light emitting device can distribute the light emitted from the individual light emitting elements to the light extraction surface. This makes it possible to obtain alight emitting device with better visibility.

Embodiment 5: Light Emitting Device and Method for Manufacturing thereof

Figure 7A:
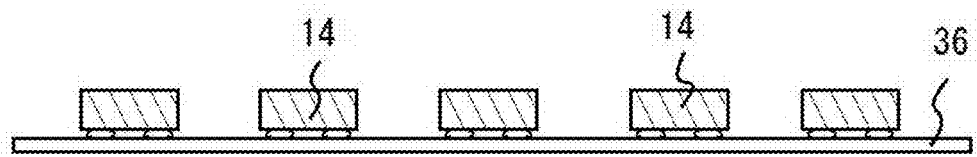
FIGS. 7A to 7F are schematic manufacturing step diagrams showing a method for manufacturing the light emitting device according to an embodiment of the present invention.

First, as shown in FIG. 7A, a plurality of light emitting elements 14 are arranged in a regular pattern on a substrate 36.

Figure 7B:
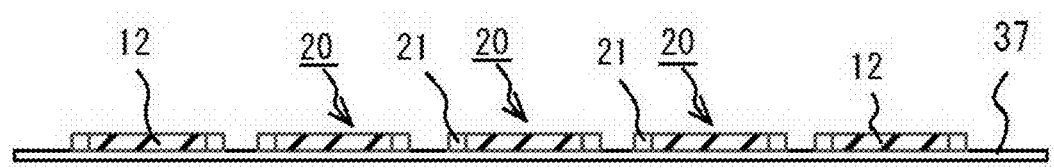

As shown in FIG. 7B, the light-transmissive members 20 each including a plurality of color conversion material layers as shown in FIG. 4 and obtained in Embodiment 2 are prepared, at positions corresponding to the light emitting elements 14 arranged on the substrate 36, on a detachable pressure-sensitive adhesive sheet serving as at support 37. The color conversion material layers 12 in the present embodiment may contain the same color conversion material, or may contain different color conversion materials.

Figure 7C:
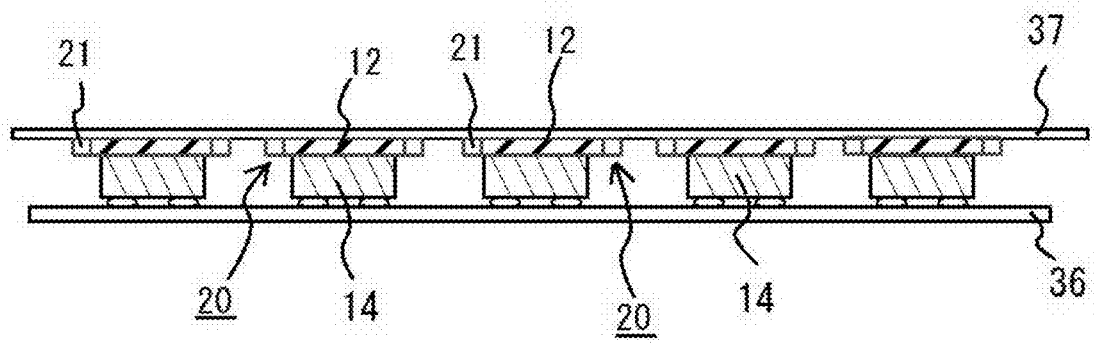

As shown in FIG. 7C, the light-transmissive members 20 are mounted collectively on the light emitting elements 14, and fixed collectively, so that the outer edges of the color conversion material layers 12 are disposed to the outside of the outer edges of the light emitting elements 14.

Figure 7D:
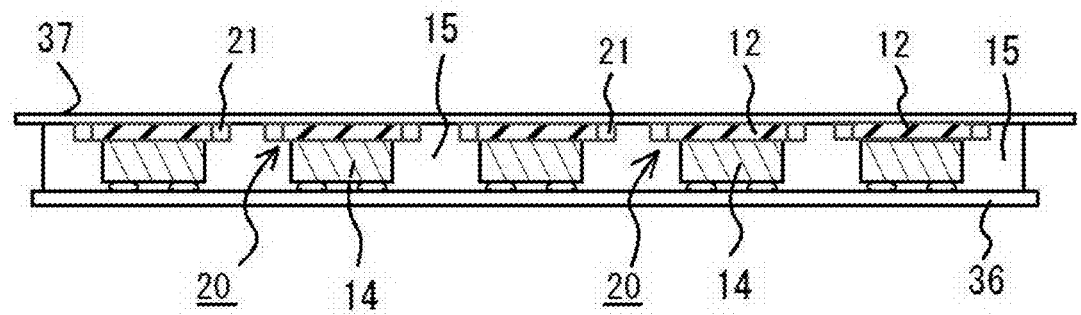

Then, as shown in FIG. 7D, with the light transmissive members still attached to the support 37, the light reflective member 15 is discharged under the light-transmissive members 20 to integrally cover the entire side surfaces of the light emitting elements 14 utilizing the fluidity of the light reflective member 15. In this case, under the light-transmissive members 20, the lower surfaces of the light-transmissive members 20 coincide with the upper surface of the light reflective member 15 under the light-transmissive members 20. On sides of the light-transmissive members 20, the upper surfaces of the light-transmissive member 20 coincide with the upper surface of the light reflective member 15.

Figure 7E:
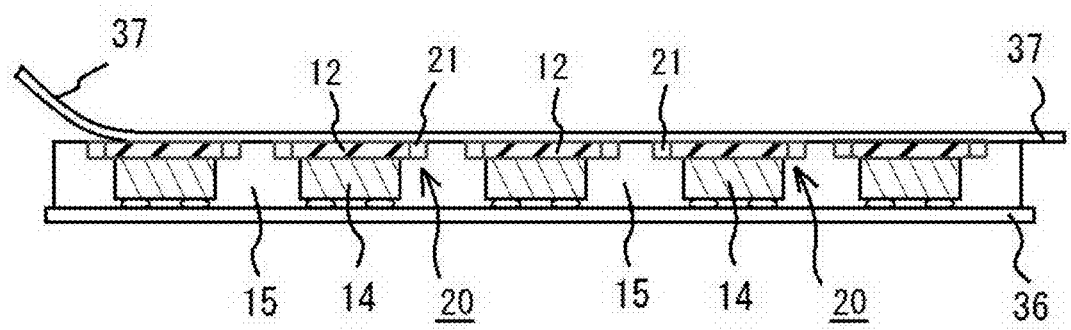
Figure 7F:
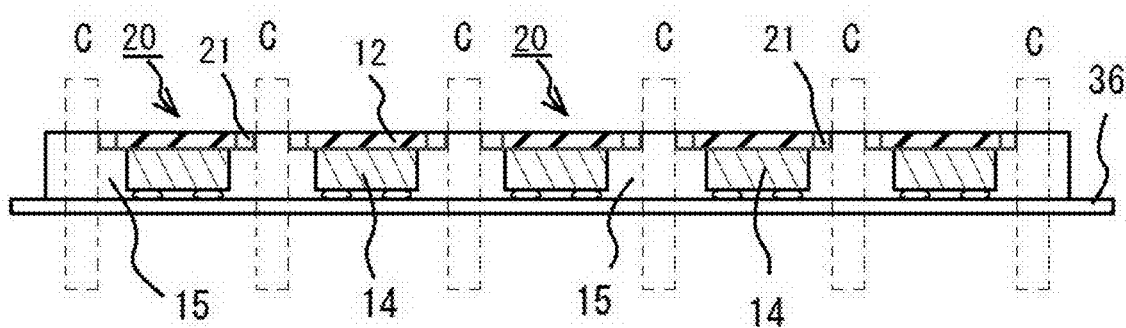

After this, as shown in FIG. 7E, the support 37 is removed from the light-transmissive members 20. With this, the support 37 serves as a mask for the light reflective member 15, and the light reflective member 15 can be disposed mainly under the light-transmissive members 20.

Then, as shown in FIG. 7E, the substrate 36 and the light reflective member 15 are cut with a dicer at the cutting positions C between the light emitting elements 14 so that the side surfaces of the light reflective member 15 will be exposed, so that an individualized a light emitting device is obtained.

Other than the above, the method is substantially the same as in Embodiment 4. This light emitting device has the same effect as in Embodiment 4.

Embodiment 6: Light Emitting Device and Method for Manufacturing thereof

In the method for manufacturing a light emitting device in this embodiment, the side surfaces of the light emitting elements are covered by a light reflective member, after which the light emitting element is cut into light emitting devices, and then the above-mentioned light-transmissive members are fixed on the light emitting elements so that the color conversion material layers will be disposed on the light emitting elements.

Figure 13A:
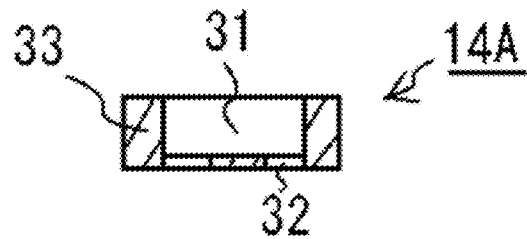
FIGS. 13A to 13D are schematic plan view of a light emitting element or a light emitting device according to other embodiment of the of the present invention.

The covering or the side surfaces of the light emitting elements with the light reflective member and the cutting into individual light emitting devices may be performed, for example, so as to obtain any of the configurations shown in FIGS. 13A to 13D. That is, as shown in FIG. 13A, a light emitting element 14A may be configured such that a semiconductor stack 31 is stacked over a sapphire substrate (serving as a semiconductor growth substrate), electrodes 32 are disposed on the same surface side of the semiconductor stack 31, and the side surfaces of the semiconductor stack of the light emitting element 14A and the semiconductor stacking surface between the electrodes is covered by a light reflective member 33.

Figure 13B:
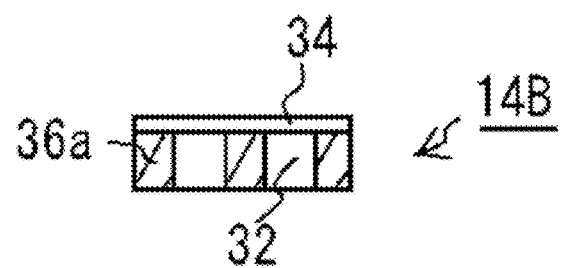
Figure 13C:
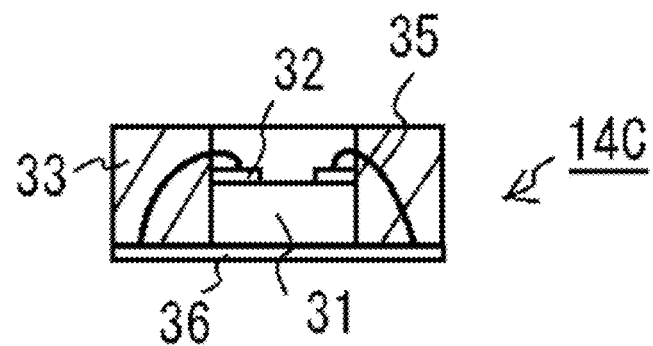
Figure 13D:
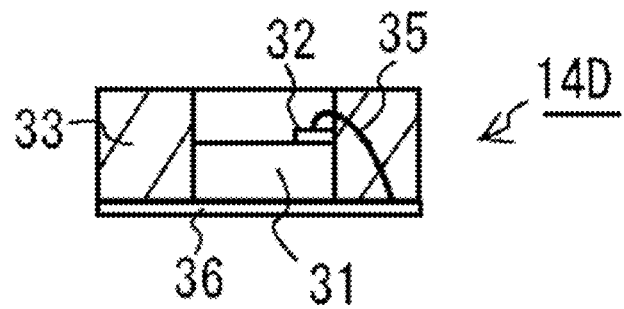

As shown in FIG. 13B, the light emitting element 14B may be configured such that a semiconductor laminate 34 is obtained by removing the sapphire substrate after the semiconductor stack has been formed on the sapphire substrate (semiconductor growth substrate), the electrodes 32 are disposed on the same surface side, and the light emitting element 14B are reinforced by a reinforcing material 36a. The reinforcing material 36a is preferably light reflective. As shown in FIG. 13C, regardless of whether or not the light emitting element includes a sapphire substrate (a semiconductor growth substrate), the configuration may be such that with the light emitting element 14C constituted by a semiconductor stack, the electrodes 32 are disposed on the same surface side, the element is mounted face-up on the substrate 36 having terminals, the electrodes 32 of the light emitting element 14C are connected by wires 35 to the terminals of the substrate 36, and the side surfaces of the semiconductor laminate of the light emitting element 14C are covered by the light reflective member 33. As shown in FIG. 13D, regardless of whether or not the light emitting element includes a sapphire substrate (a semiconductor growth substrate), the configuration may be such that in the light emitting element 14B including a semiconductor stack, the element has a vertical structure, in which the electrodes 32 are not disposed on the same surface side and are instead disposed on different surface sides and mounted on the substrate 36 having terminals, one of the electrodes 32 of the light emitting element 14D is connected to the terminal of the substrate 36 by a wire 35, the other electrode is connected to the terminal of the substrate 36 by solder, and the side surfaces of the semiconductor laminate of the light emitting element 14D are covered by the light reflective member 33.

Figure 14A:
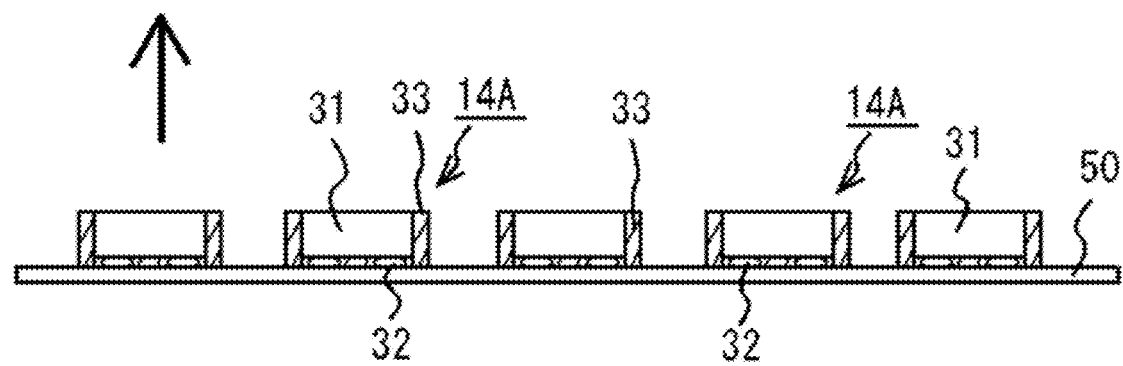
FIGS. 14A to 14C are schematic manufacturing step diagrams showing a method for manufacturing the light emitting device according to still other embodiment of the present invention.

For example, as shown in FIG. 14A, a plurality of the light emitting elements 14A with the light reflective members 33 are joined to a mounting substrate 50 of a light source device to which the light emitting device will be applied, such as a linear light source. In this case, for example, the light emitting elements 14A are joined in top view type so that light is emitted in the direction of the arrow.

Figure 14B:
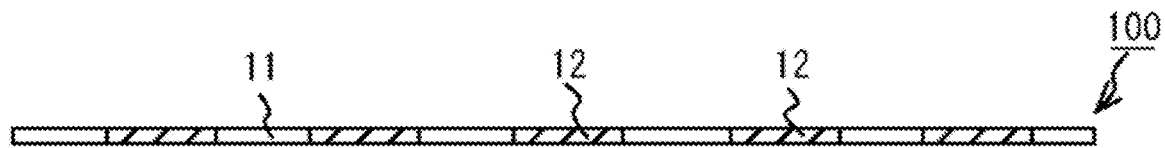
Figure 14C:
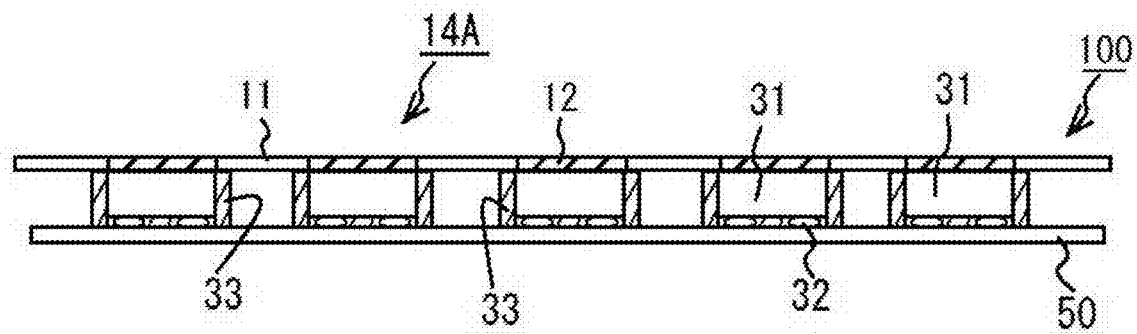

After this, the light-transmissive member 100 having a plurality of color conversion material layers 12 as shown in FIG. 14B is fixed by an adhesive member or by fitting so that the color conversion material layers 12 are disposed on the respective light emitting elements 14A as shown in FIG. 14C. This allows light emitting devices to be obtained in which a plurality of the light emitting elements 14A are arranged.

Then, the light reflective sheet 11 of the light-transmissive member 10 and the mounting substrate 50 may be divided by cutting with a dicer or the like between the light emitting elements 14A to obtain light emitting devices including a single light emitting element.

Accordingly, fixing the light-transmissive member after secondary mounting of the light emitting elements can avoid hysteresis of the resin curing and element mounting in the assembly step. The hysteresis of solder reflow or the like during secondary mounting can also be avoided.

Modification Example 8: Method for Manufacturing Light Emitting Device

Figure 15A:
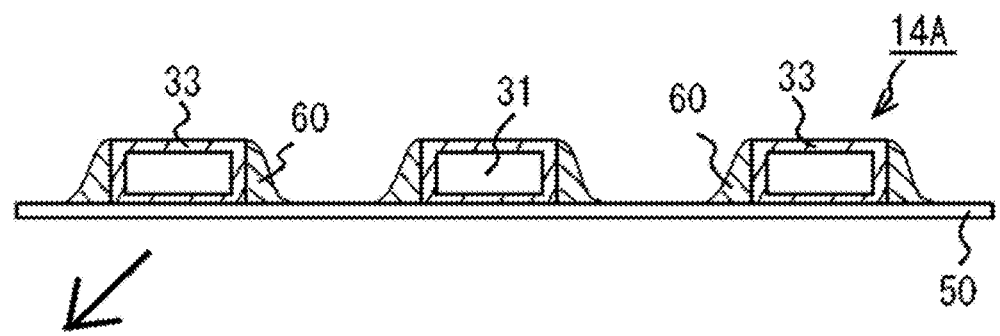
FIGS. 15A and 15B are schematic manufacturing step diagrams showing a method for manufacturing the light emitting device according to still other embodiment of the present invention.
Figure 15B:
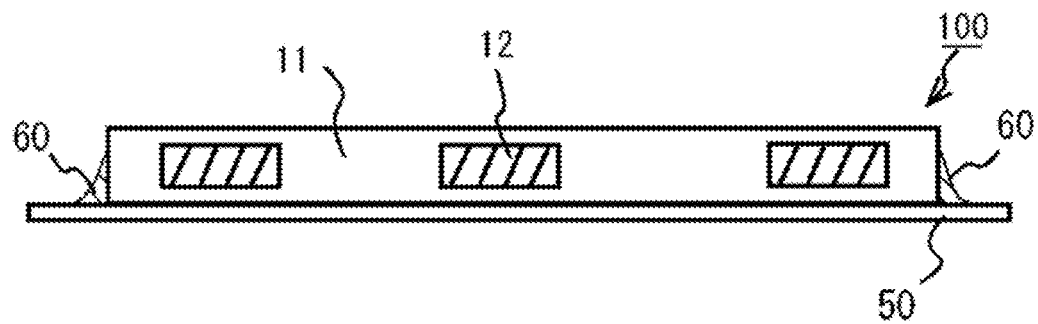
Figure 15C:
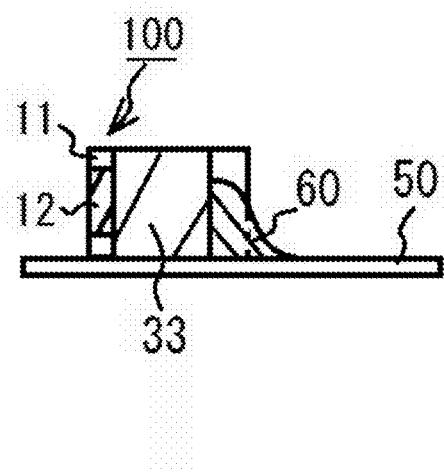
FIG. 15C is a schematic lateral side view of FIG. 15B.

In this modification example, as shown in FIG. 15A, for example, the light emitting elements 14A are joined to the mounting substrate 50 to obtain a side-view type light emitting device so that light is emitted in the direction of the arrow. After this, the light-transmissive member 100 including a plurality of color conversion material layers 12 is fixed by an adhesive member to the mounting substrate 50 so as to be substantially perpendicular to the mounting substrate 50 and so that the color conversion material layers 12 are disposed on the respective light emission surfaces of the light emitting elements 14A. This allows light emitting devices to be obtained in which a plurality of the light emitting elements 14A are arranged.

The light emitting device of the present invention can be used for backlight light sources of liquid crystal displays, various kinds of lighting fixtures, and various kinds of display devices such as large displays, advertisements and destination guides, and image reading devices in digital video cameras, facsimiles, copiers, scanners and the like, and projector devices. It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:
1. A light emitting device comprising:
a first light emitting element having a first electrode formation surface on which a pair of electrodes are arranged, a first light extraction surface opposite from the first electrode formation surface, and a first side surface extending between the first electrode formation surface and the first light extraction surface;
a second light emitting element having a second electrode formation surface on which a pair of electrodes are arranged, a second light extraction surface opposite from the second electrode formation surface, and a second side surface extending between the second electrode formation surface and the second light extraction surface;
a first color conversion material layer having a first color conversion surface facing the first light extraction surface of the first light emitting element;
a second color conversion material layer having a second color conversion surface facing the second light extraction surface of the second light emitting element;
a support member supporting the first color conversion material layer and the second color conversion material layer; and
a light reflective member covering the first side surface of the first light emitting element and the second side surface of the second light emitting element, at least a part of an upper surface of the light reflective member being positioned closer to the support member than the first color conversion material layer and the second color conversion material layer, a thickness of the light reflective member as measured in a direction orthogonal to a surface of the support member is larger at a center position between the first light emitting element and the second light emitting element than at a position adjacent to the first light emitting element or at a position adjacent to the second light emitting element.
2. The light emitting device according to claim 1, further comprising
a third light emitting element having a third electrode formation surface on which a pair of electrodes are arranged, a third light extraction surface opposite from the third electrode formation surface, and a third side surface extending between the third electrode formation surface and the third light extraction surface;
a third color conversion material layer having a third color conversion surface facing the third light extraction surface of the third light emitting element,
wherein the light reflective member covers the third side surface of the third light emitting element, and the at least the part of the upper surface of the light reflective member is positioned closer to the support member than the third color conversion material layer.
3. The light emitting device according to claim 1, wherein an outer edge of the first light emitting element is disposed inside of an outer edge of the first color conversion material layer in a plan view.
4. The light emitting device according to claim 1, wherein the light reflective member is in contact with the support member.
5. The light emitting device according to claim 1, wherein the first color conversion material layer is in contact with the support member.

6. The light emitting device according to claim 1, wherein the first light extraction surface of the first light emitting element and the second light extraction surface of the second light emitting element are arranged on the same plane.

7. The light emitting device according to claim 1, further comprising
a substrate on which the first light emitting element and the second light emitting element are arranged.

8. The light emitting device according to claim 2, wherein an outer edge of the first light emitting element is disposed inside of an outer edge of the first color conversion material layer in a plan view.

9. The light emitting device according to claim 2, wherein the light reflective member is in contact with the support member.

10. The light emitting device according to claim 2, wherein
the first color conversion material layer is in contact with the support member.

11. The light emitting device according to claim 2, wherein
the first light extraction surface of the first light emitting element, the second light extraction surface of the second light emitting element, and the third light extraction surface of the third light emitting element are arranged on the same plane.

12. The light emitting device according to claim 2, further comprising
a substrate on which the first light emitting element, the second light emitting element, and the third light emitting element are arranged.

13. The light emitting device according to claim 3, wherein
the light reflective member is in contact with the support member.

14. The light emitting device according to claim 3, wherein
the first color conversion material layer is in contact with the support member.

15. The light emitting device according to claim 3, wherein
the first light extraction surface of the first light emitting element and the second light extraction surface of the second light emitting element are arranged on the same plane.

16. The light emitting device according to claim 3, further comprising
a substrate on which the first light emitting element and the second light emitting element are arranged.

17. The light emitting device according to claim 4, wherein
the first color conversion material layer is in contact with the support member.

18. The light emitting device according to claim 4, wherein
the first light extraction surface of the first light emitting element and the second light extraction surface of the second light emitting element are arranged on the same plane.

19. The light emitting device according to claim 4, further comprising
a substrate on which the first light emitting element and the second light emitting element are arranged.

20. The light emitting device according to claim 5, wherein
the first light extraction surface of the first light emitting element and the second light extraction surface of the second light emitting element are arranged on the same plane.

* * * * *